(12) United States Patent
Chiang et al.

(10) Patent No.: US 10,868,184 B2
(45) Date of Patent: Dec. 15, 2020

(54) FIN FIELD EFFECT TRANSISTOR (FINFET) DEVICE STRUCTURE WITH HARD MASK LAYER OVER GATE STRUCTURE AND METHOD FOR FORMING THE SAME

(71) Applicant: Taiwan Semiconductor Manufacturing Co., Ltd., Hsinchu (TW)

(72) Inventors: Yu-Ho Chiang, Hsinchu (TW); Cheng-Han Wu, Hsinchu (TW); Jyh-Huei Chen, Hsinchu (TW); Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 43 days.

(21) Appl. No.: 16/199,906

(22) Filed: Nov. 26, 2018

(65) Prior Publication Data
US 2020/0044072 A1 Feb. 6, 2020

Related U.S. Application Data

(60) Provisional application No. 62/712,379, filed on Jul. 31, 2018.

(51) Int. Cl.
*H01L 29/78* (2006.01)
*H01L 29/66* (2006.01)
*H01L 29/417* (2006.01)

(52) U.S. Cl.
CPC ...... *H01L 29/785* (2013.01); *H01L 29/41791* (2013.01); *H01L 29/66795* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,378,952 B1 * | 6/2016 | Basker .............. H01L 21/02636 |
| 9,520,482 B1 | 12/2016 | Chang et al. |
| 9,576,814 B2 | 2/2017 | Wu et al. |
| 10,672,656 B2 * | 6/2020 | Shieh .................. H01L 23/5283 |

* cited by examiner

*Primary Examiner* — Hrayr A Sayadian
(74) *Attorney, Agent, or Firm* — Birch, Stewart, Kolasch & Birch, LLP

(57) ABSTRACT

A FinFET device structure is provided. The FinFET device structure includes a fin structure formed over a substrate and a gate structure formed over the fin structure. The FinFET device structure also includes a contact formed over the fin structure and adjacent to the gate structure. The FinFET device structure further includes a first hard mask layer formed over the gate structure, and an upper portion of the first hard mask layer has an inverted-T shape. In addition, the FinFET device structure includes a second hard mask layer formed over the contact, and the second hard mask layer has a T shape.

20 Claims, 29 Drawing Sheets

FIN FIELD EFFECT TRANSISTOR (FINFET) DEVICE STRUCTURE WITH HARD MASK LAYER OVER GATE STRUCTURE AND METHOD FOR FORMING THE SAME

CROSS REFERENCE TO RELATED APPLICATIONS

This application claims the benefit of U.S. Provisional Application No. 62/712,379 filed on Jul. 31, 2018, and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
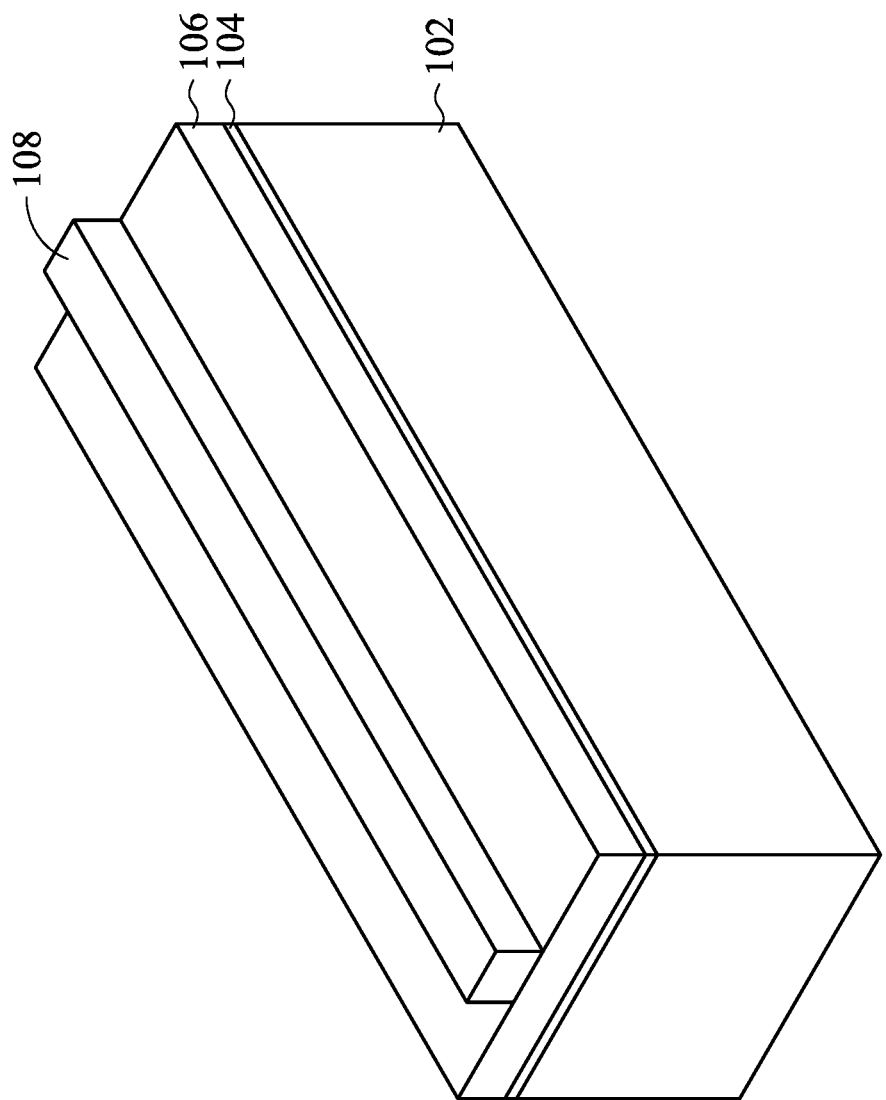
FIGS. 1A-1T are perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Embodiments of a fin field effect transistor (FinFET) device structure are provided in accordance with some embodiments of the disclosure. The FinFET device structure includes an inverted T-shaped hard mask layer over a gate structure, and a T-shaped hard mask layer over a contact which is adjacent to the gate structure. Therefore, a conductive plug formed afterwards penetrating through the inverted T-shaped hard mask layer can be prevented from being shifted over the contact, so as to ensure the isolation between the gate structure and the contact.

Figure 1B:
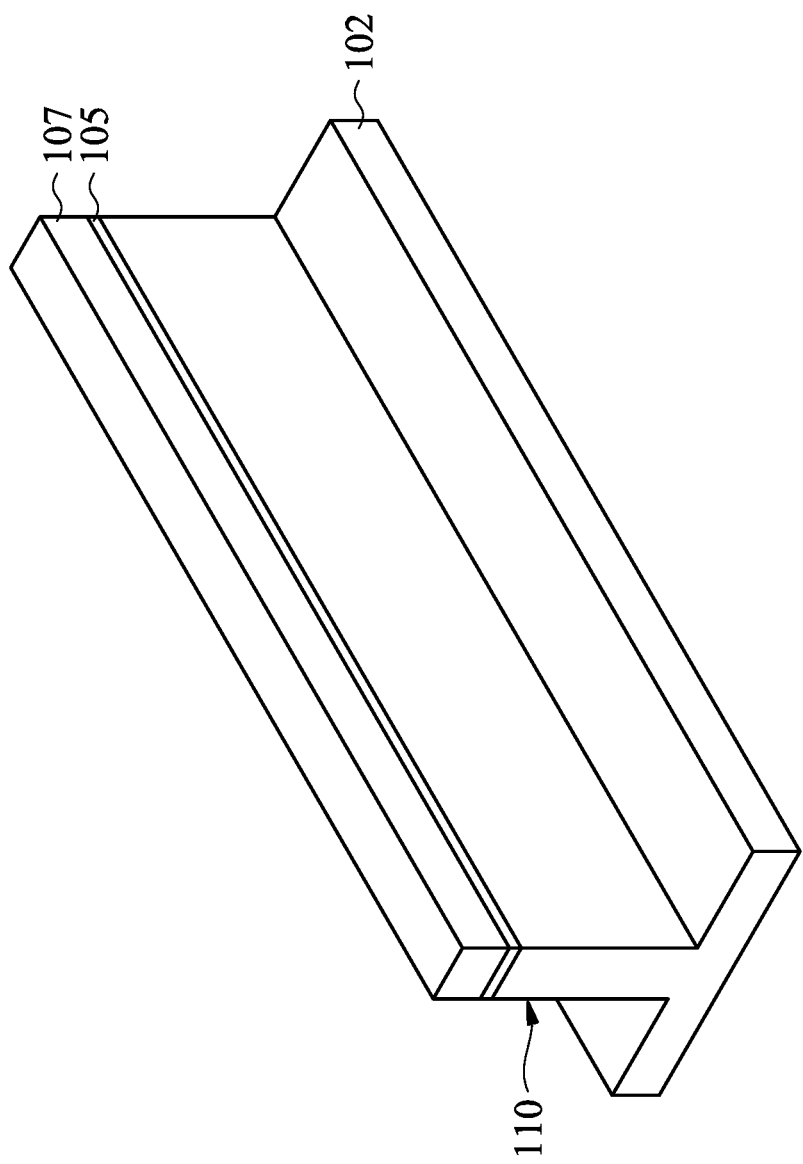
Figure 1C:
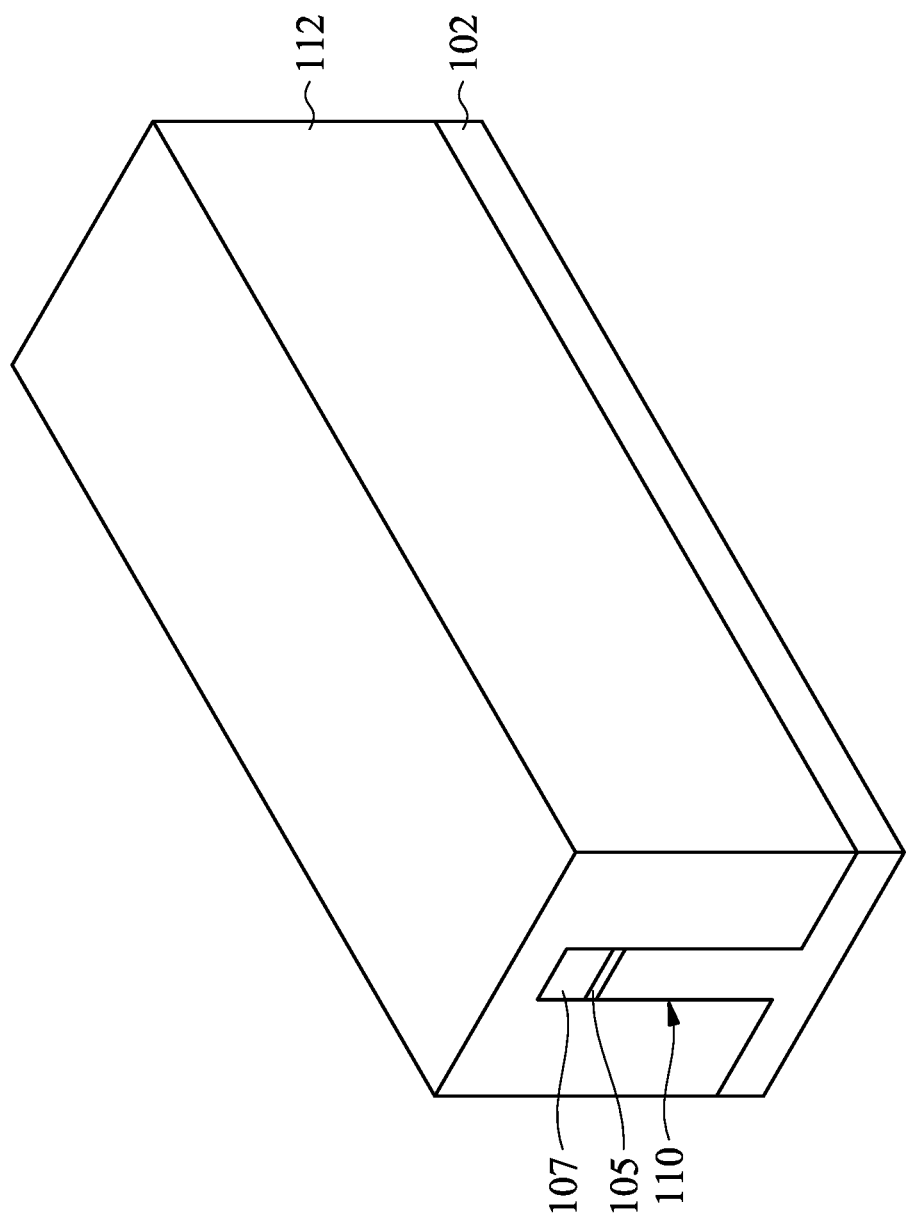
Figure 1D:
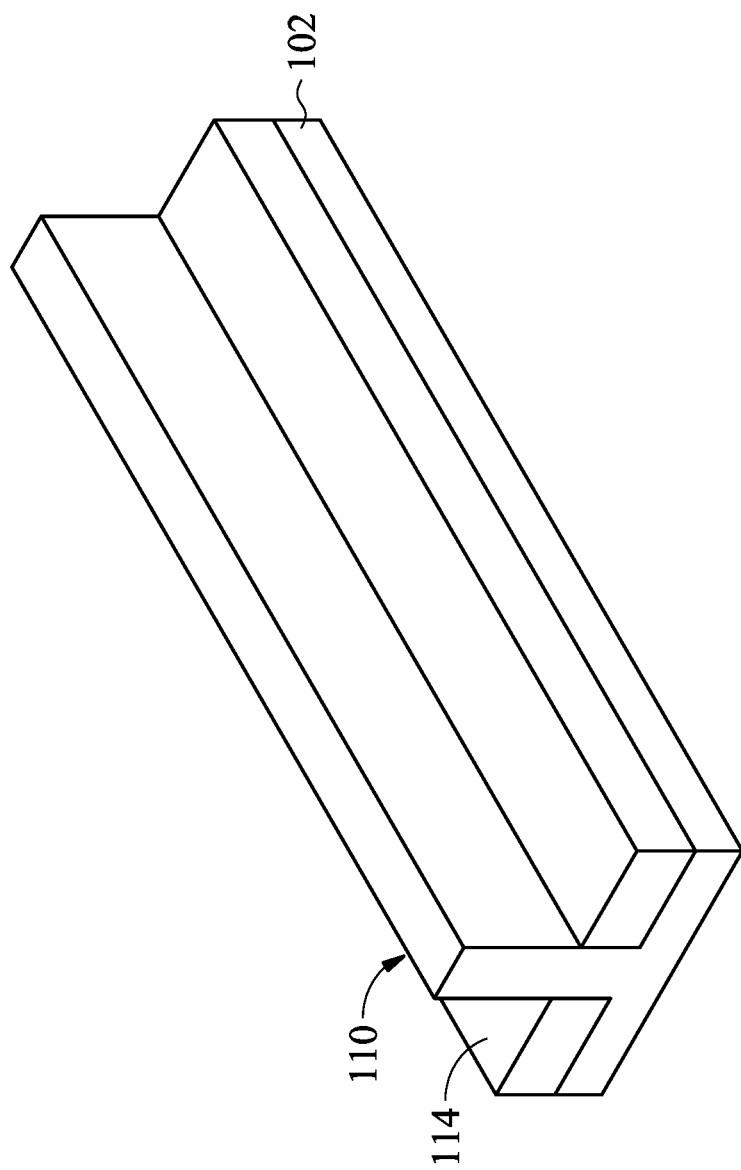
Figure 1E:
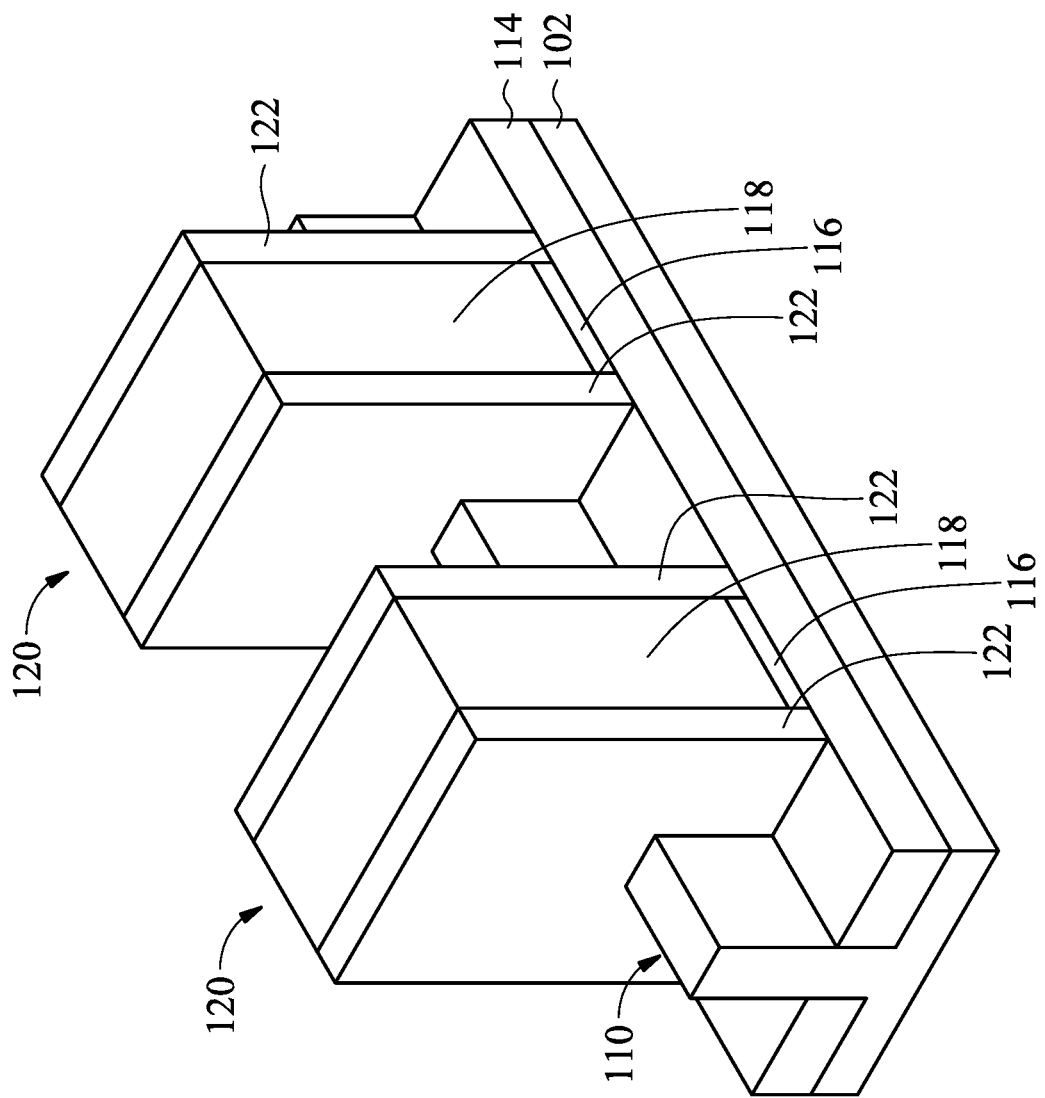
Figure 1F:
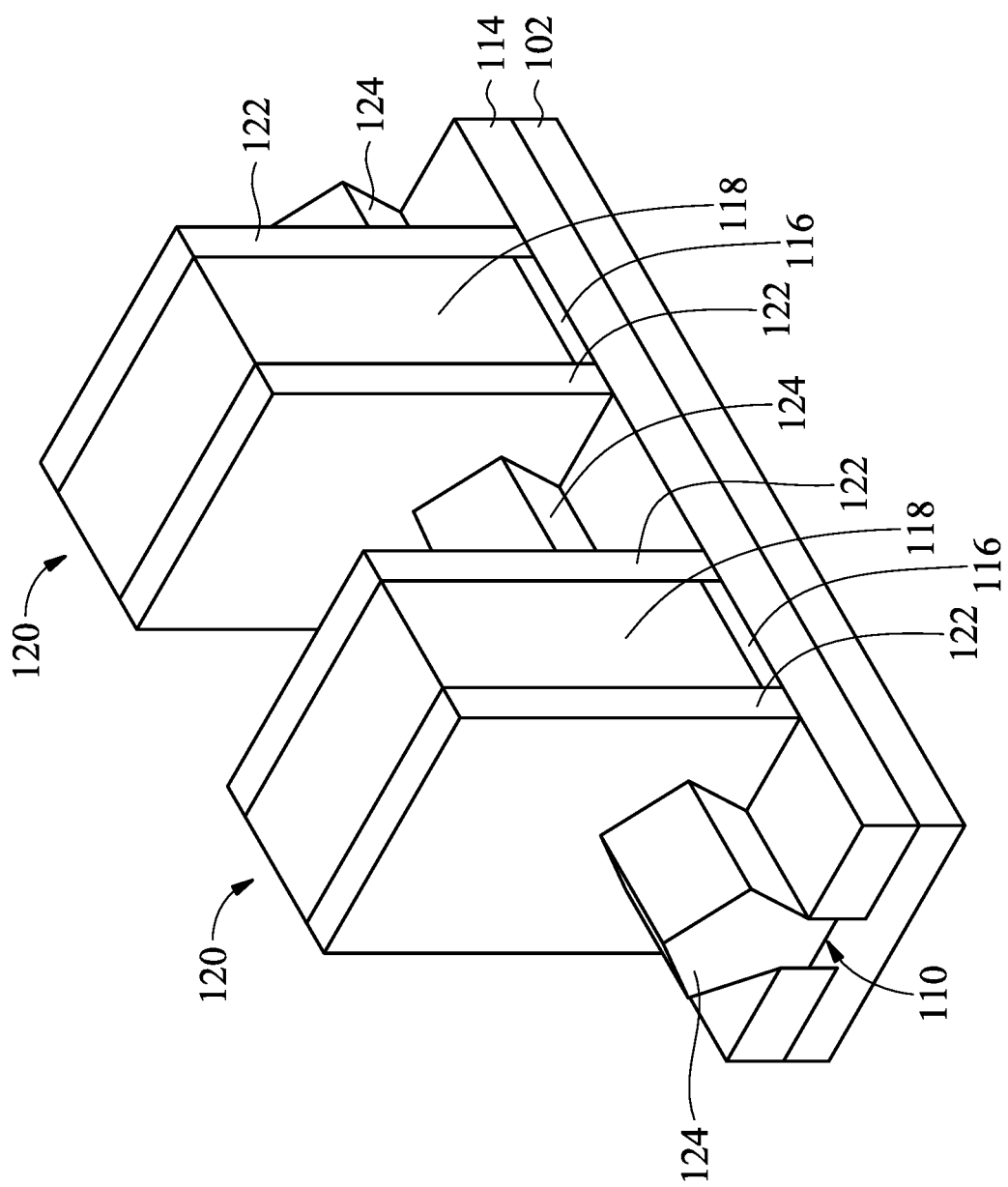
Figure 1G:
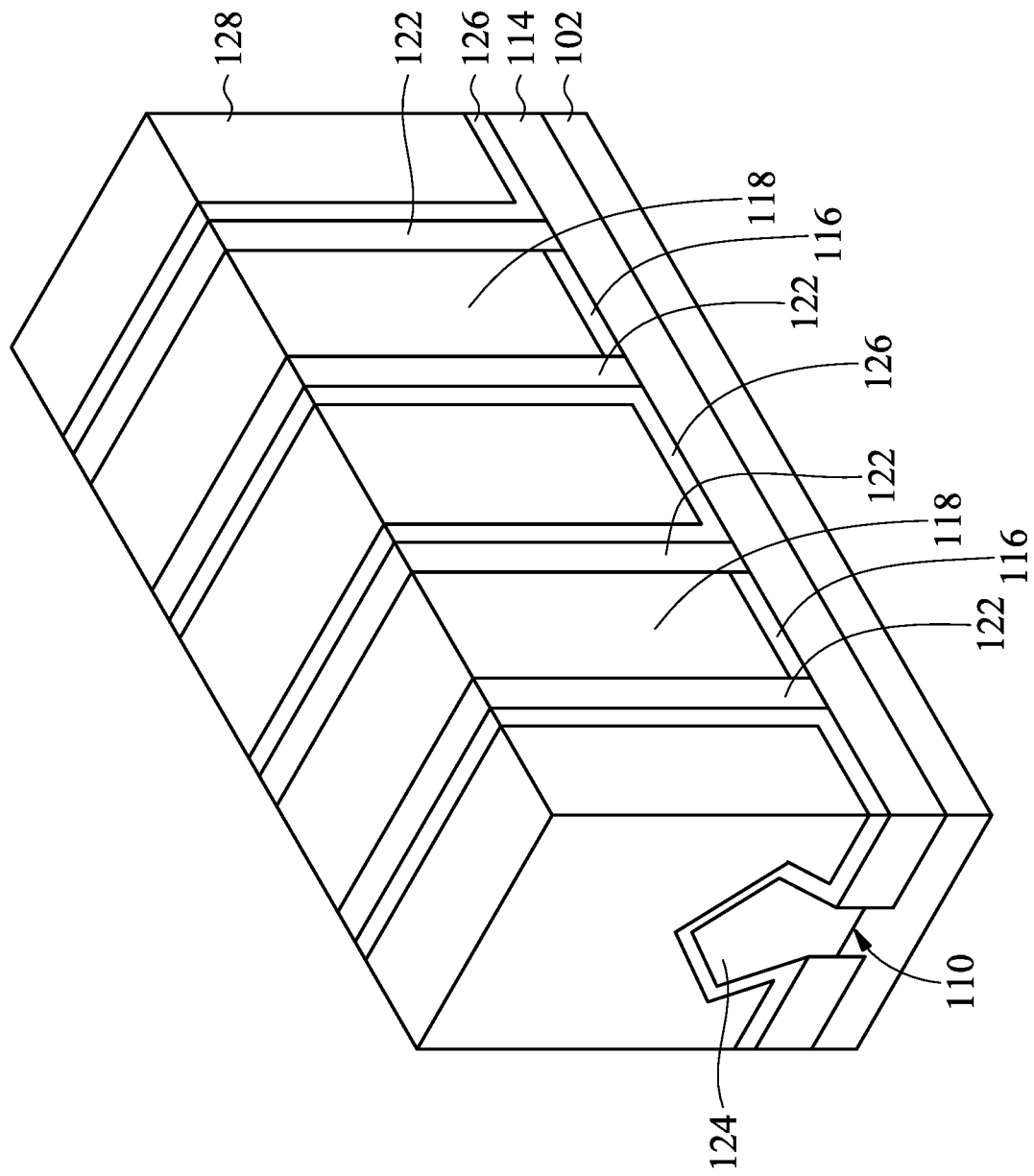
Figure 1H:
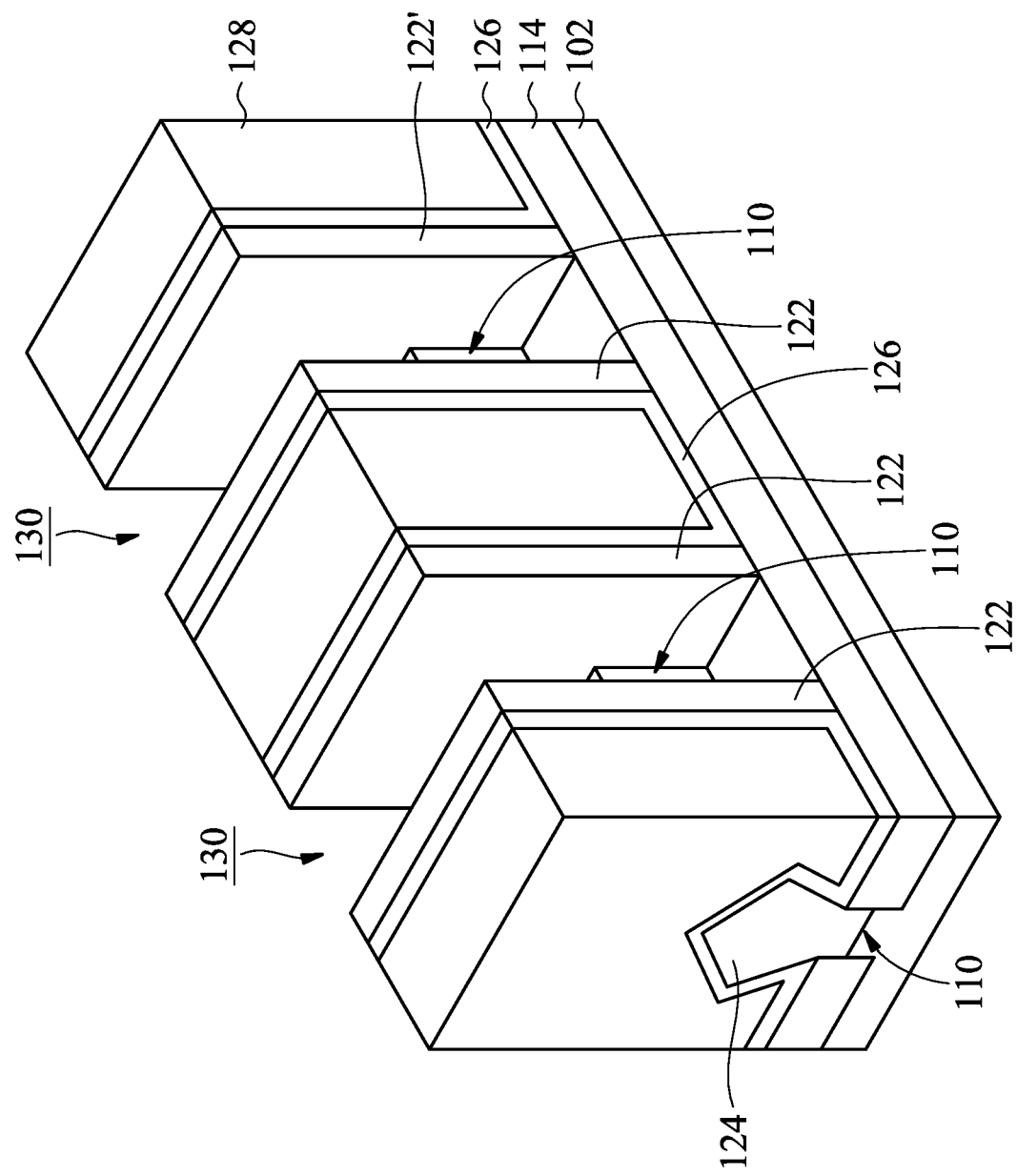
Figure 1I:
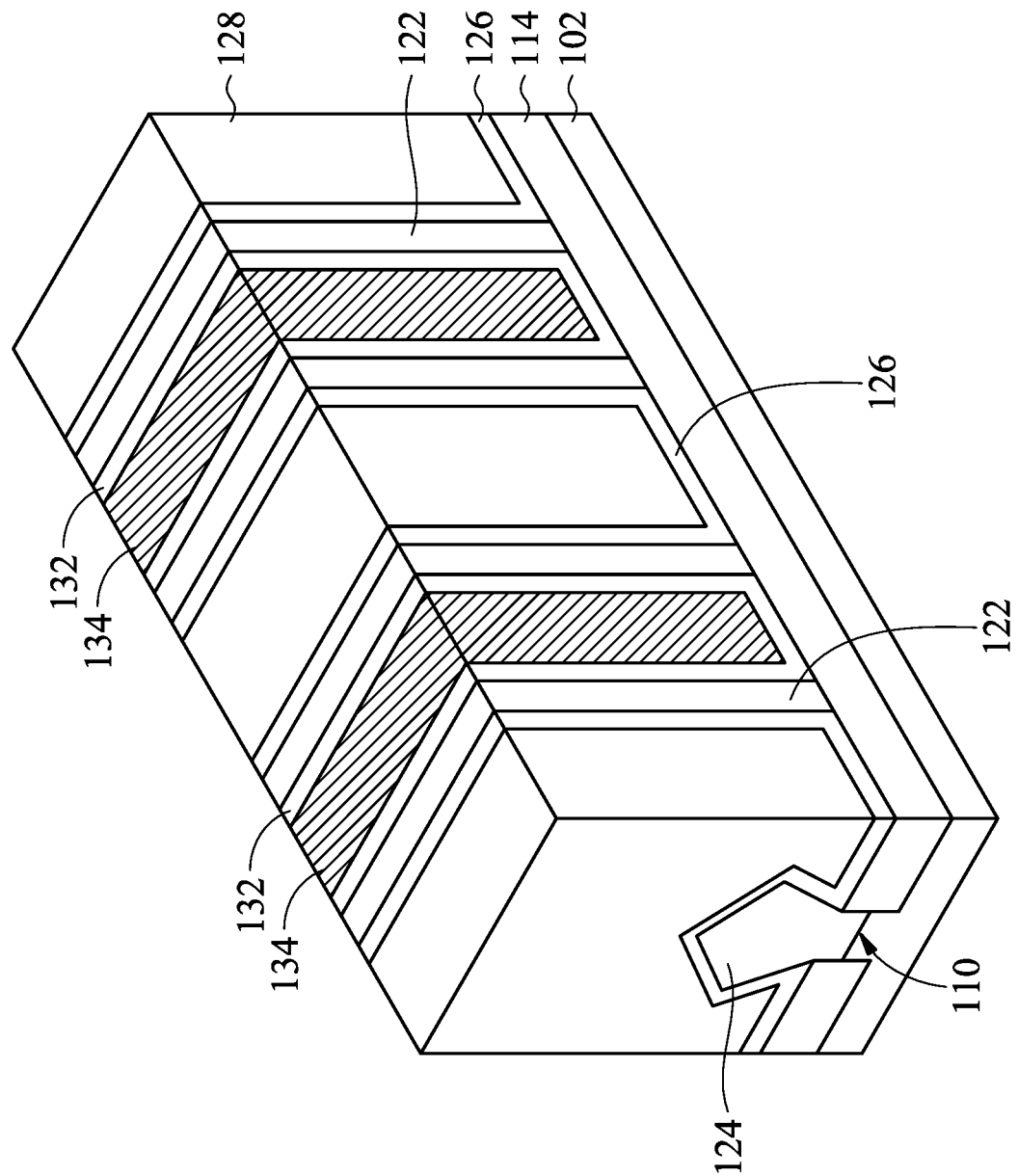
Figure 1J:
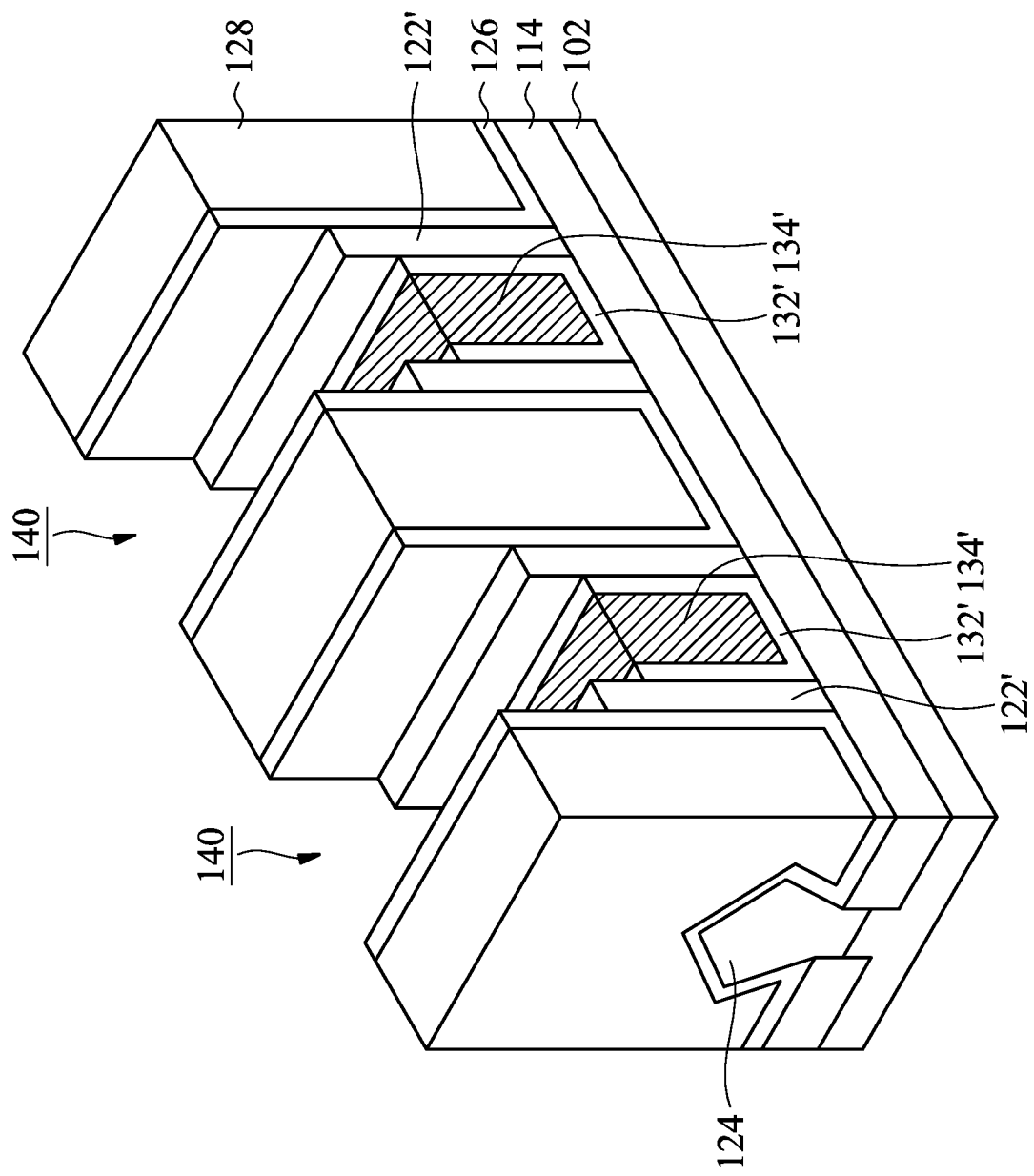
Figure 1K:
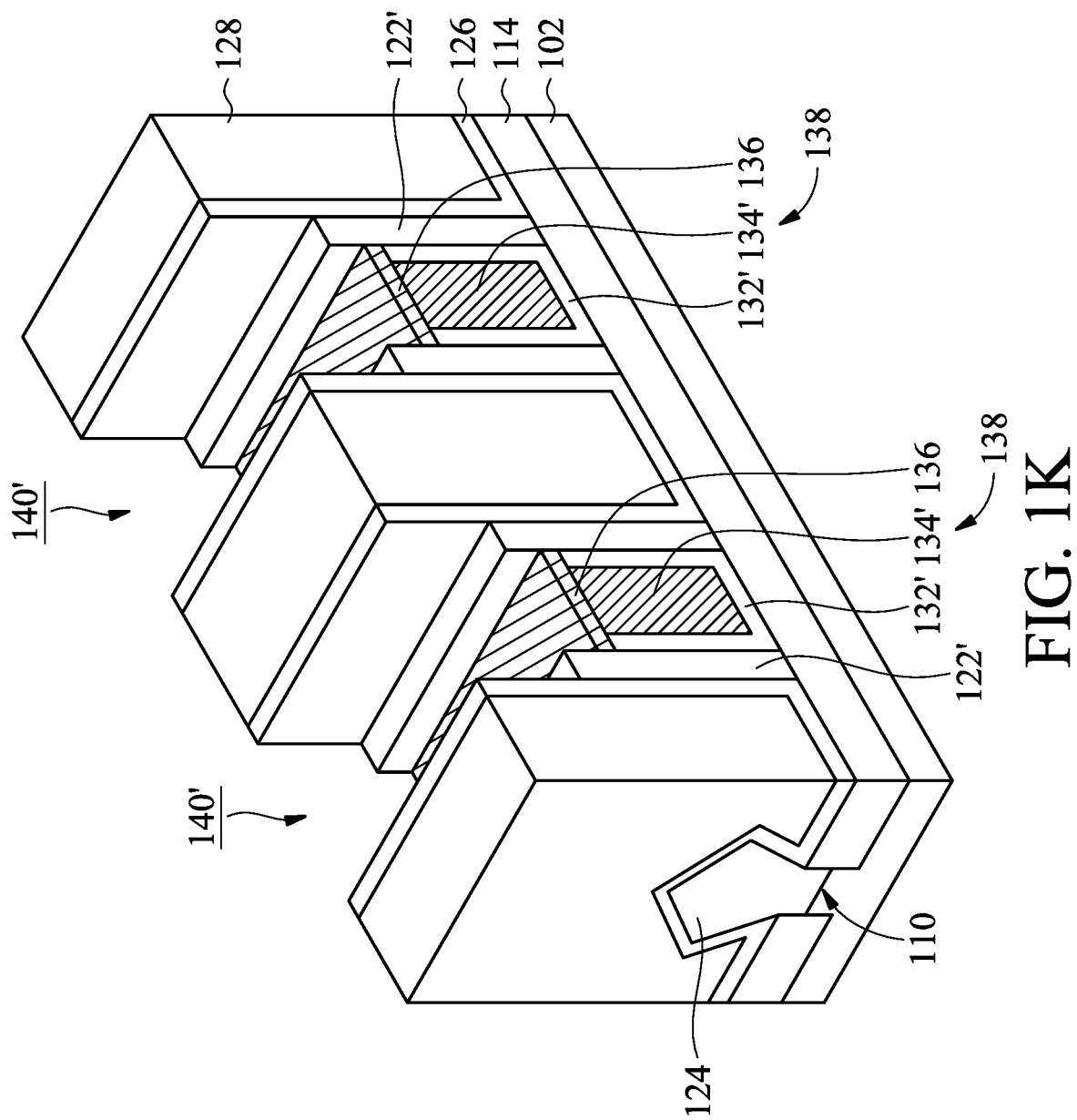
Figure 1L:
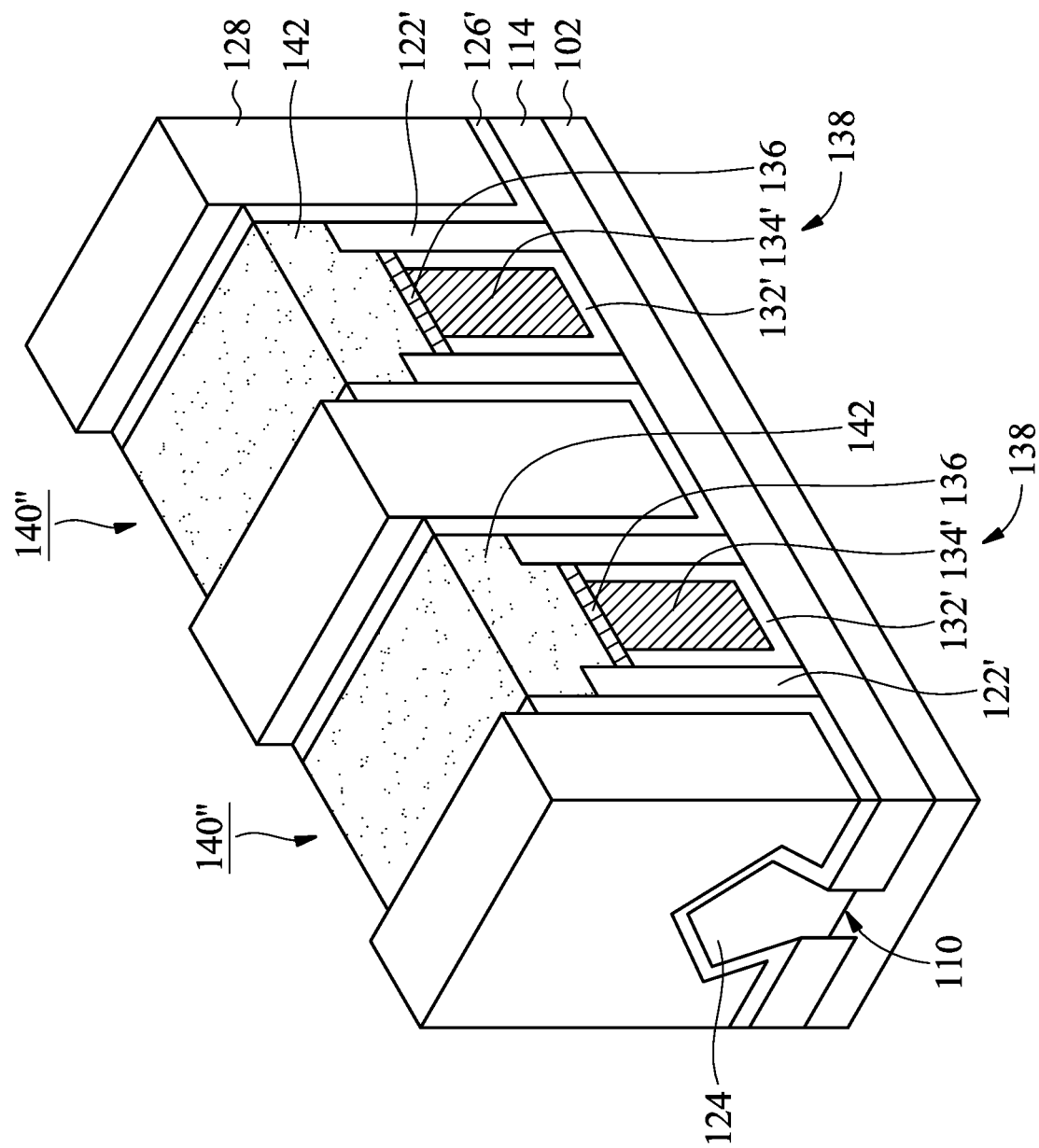
Figure 1M:
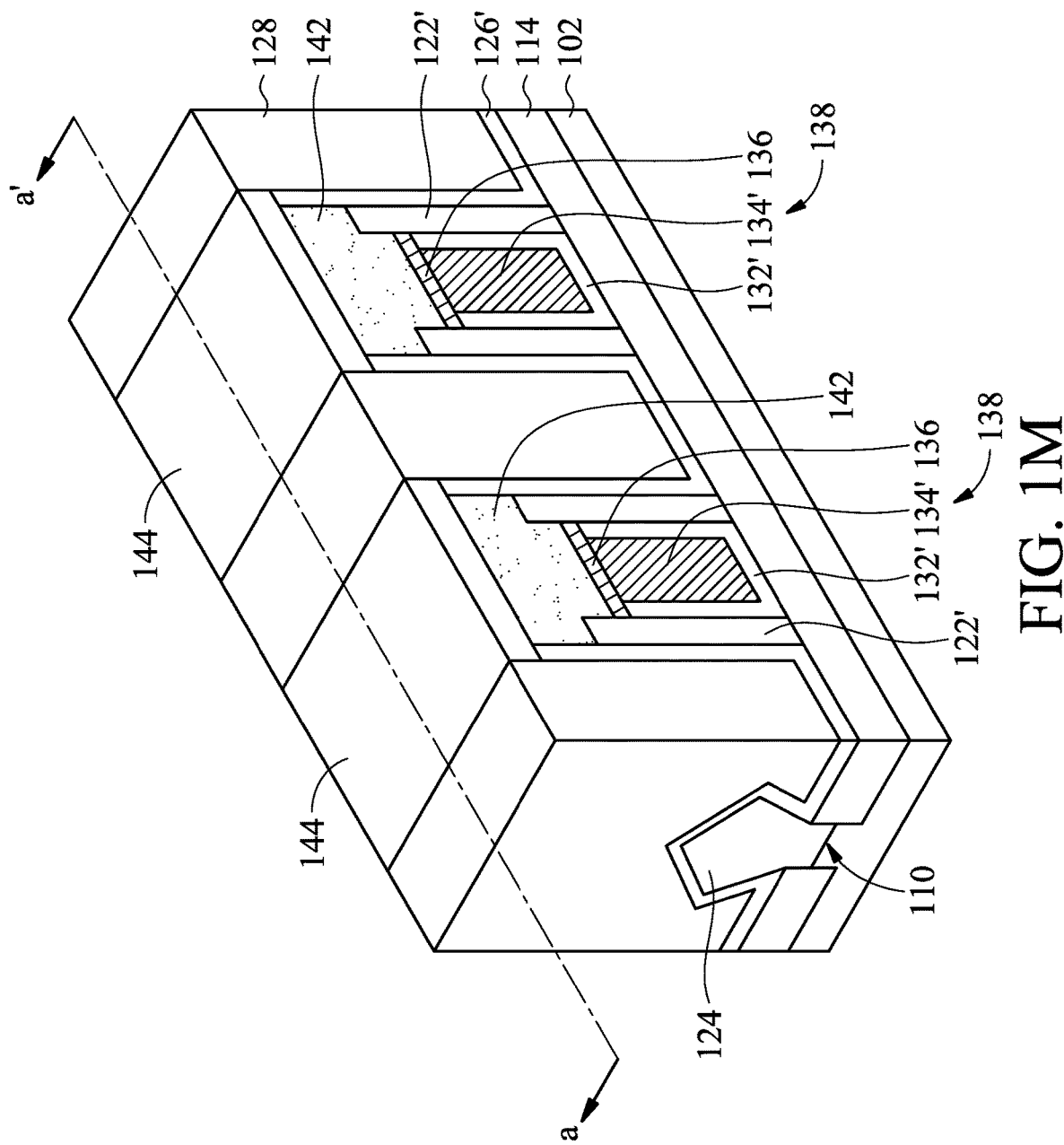
Figure 1N:
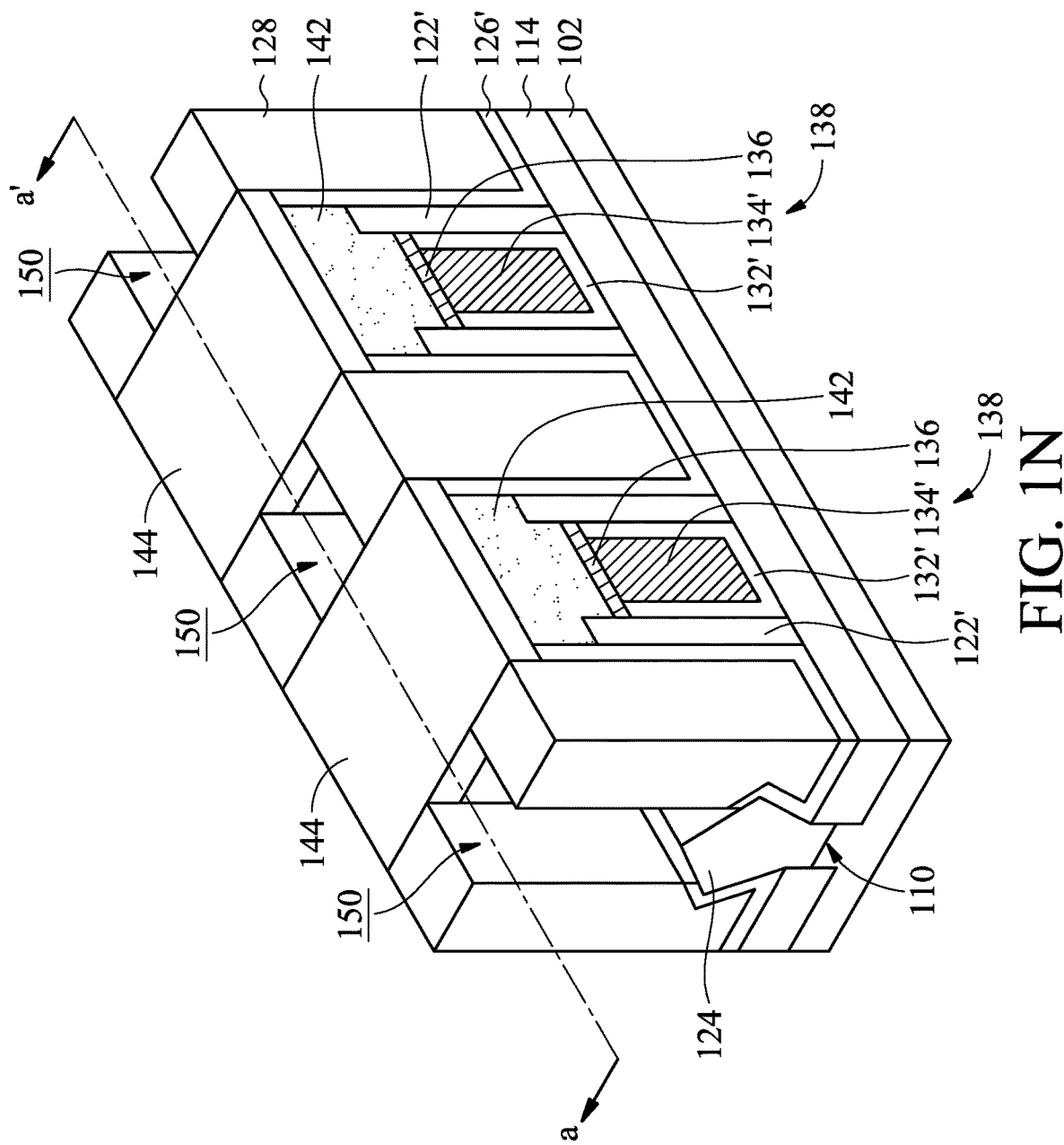
Figure 1O:
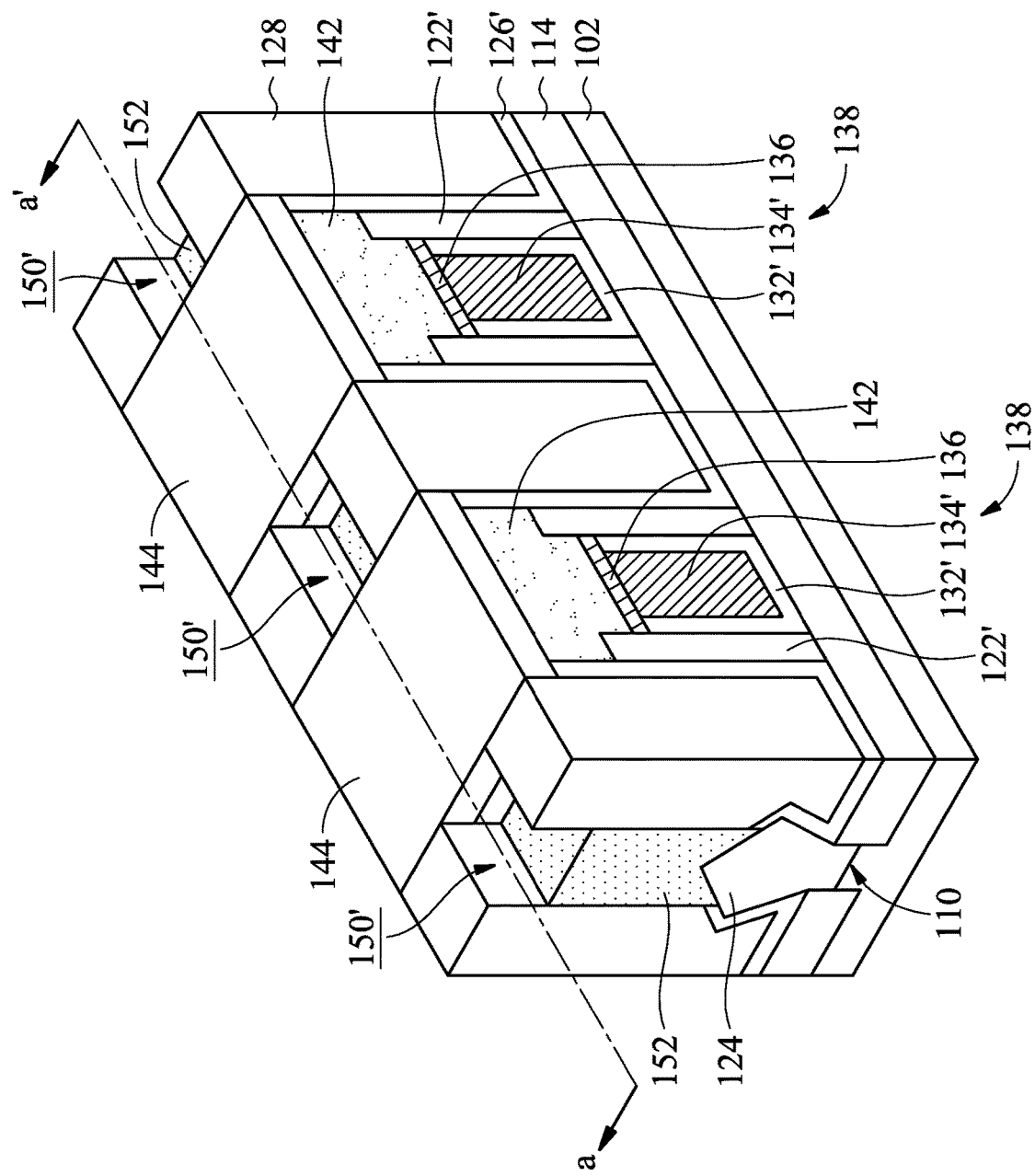
Figure 1P:
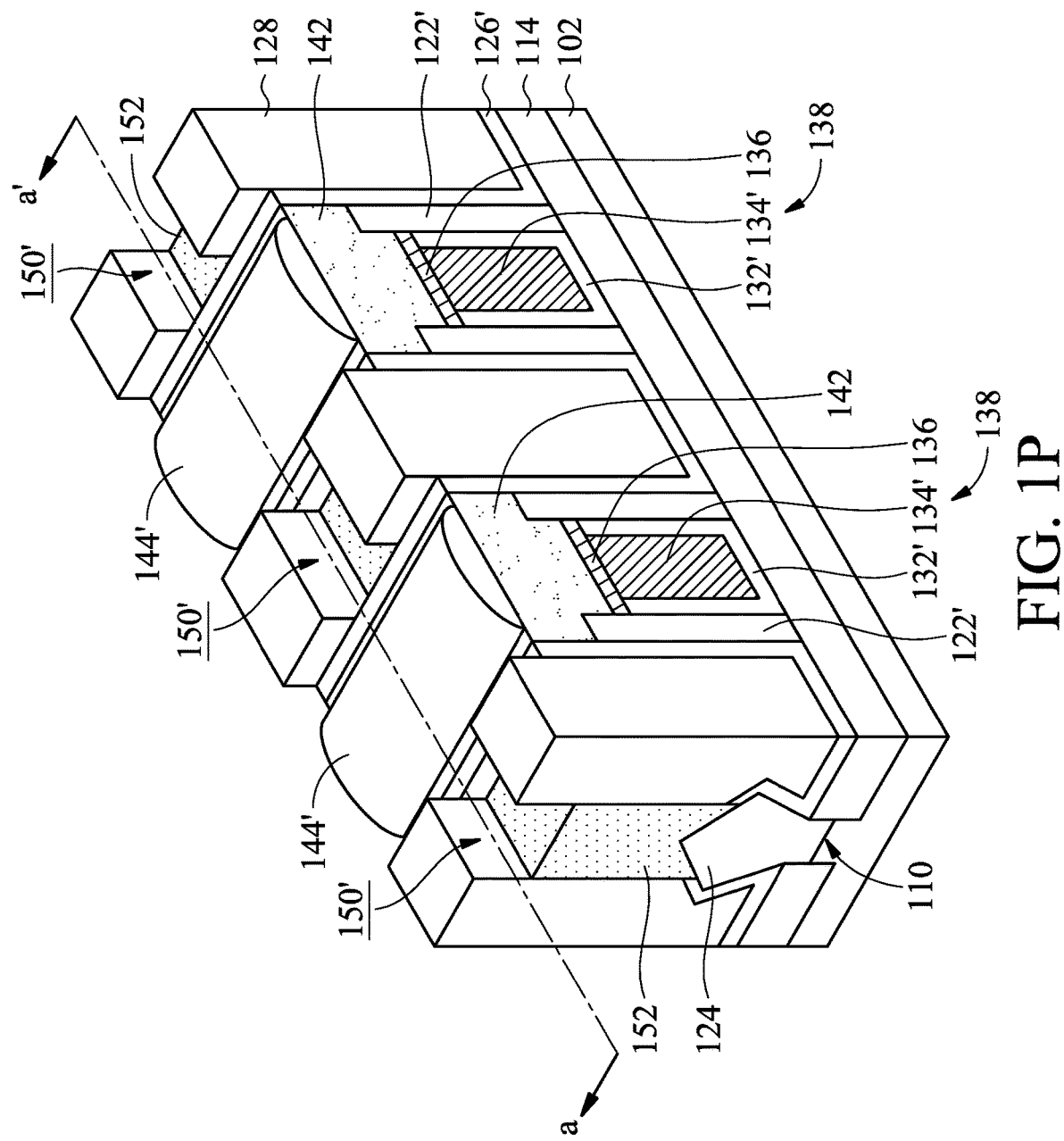
Figure 1Q:
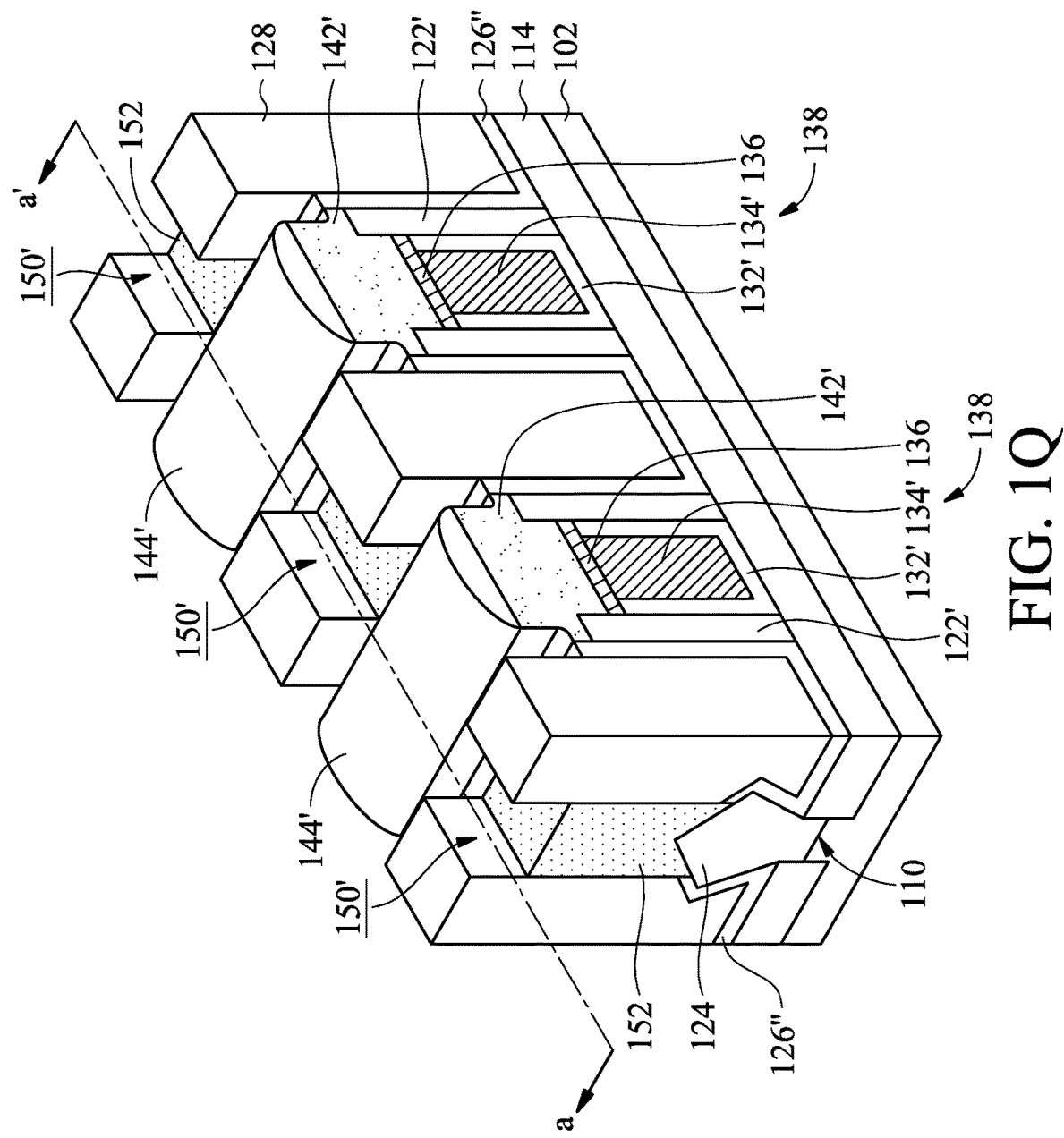
Figure 1R:
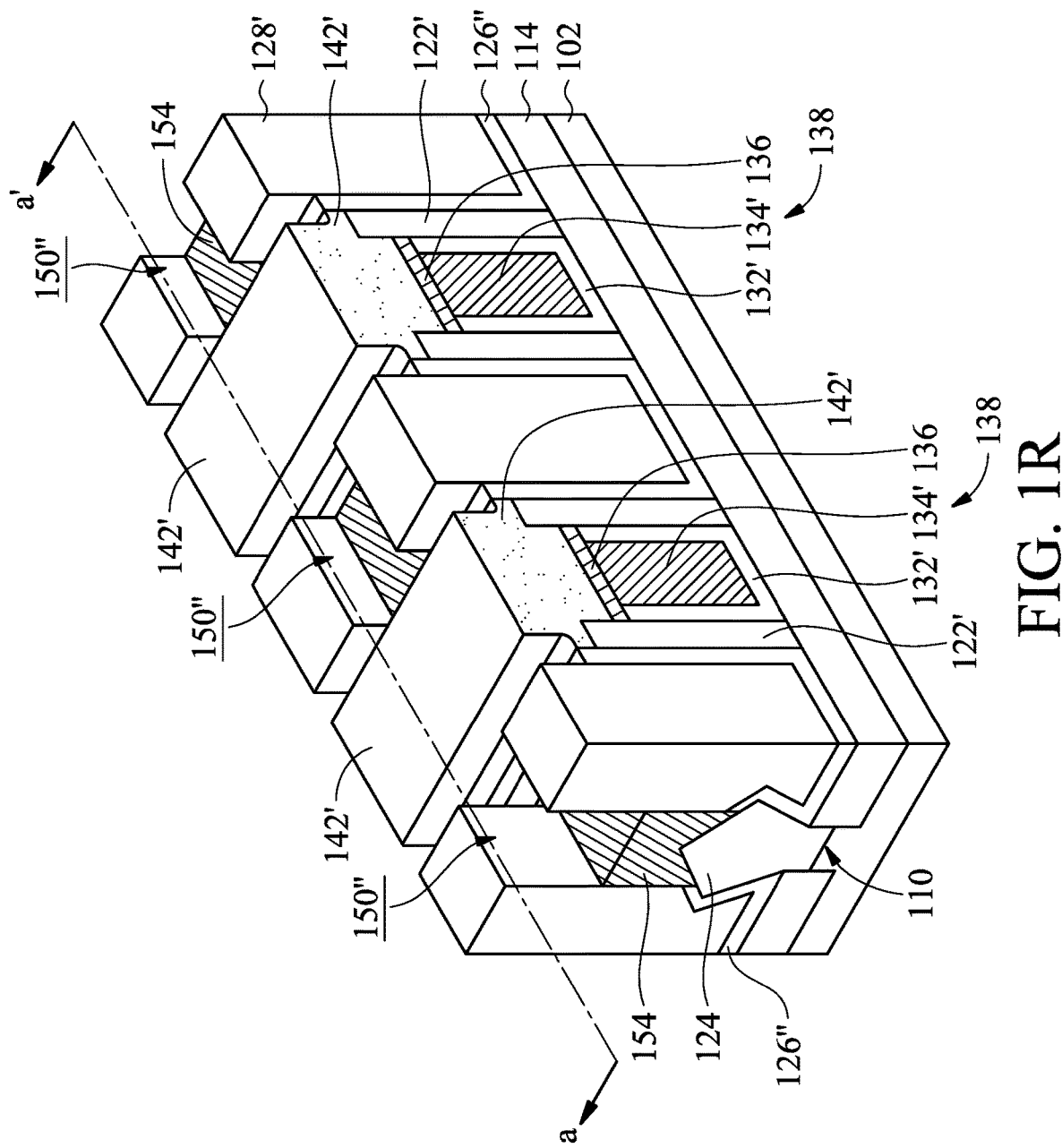
Figure 1S:
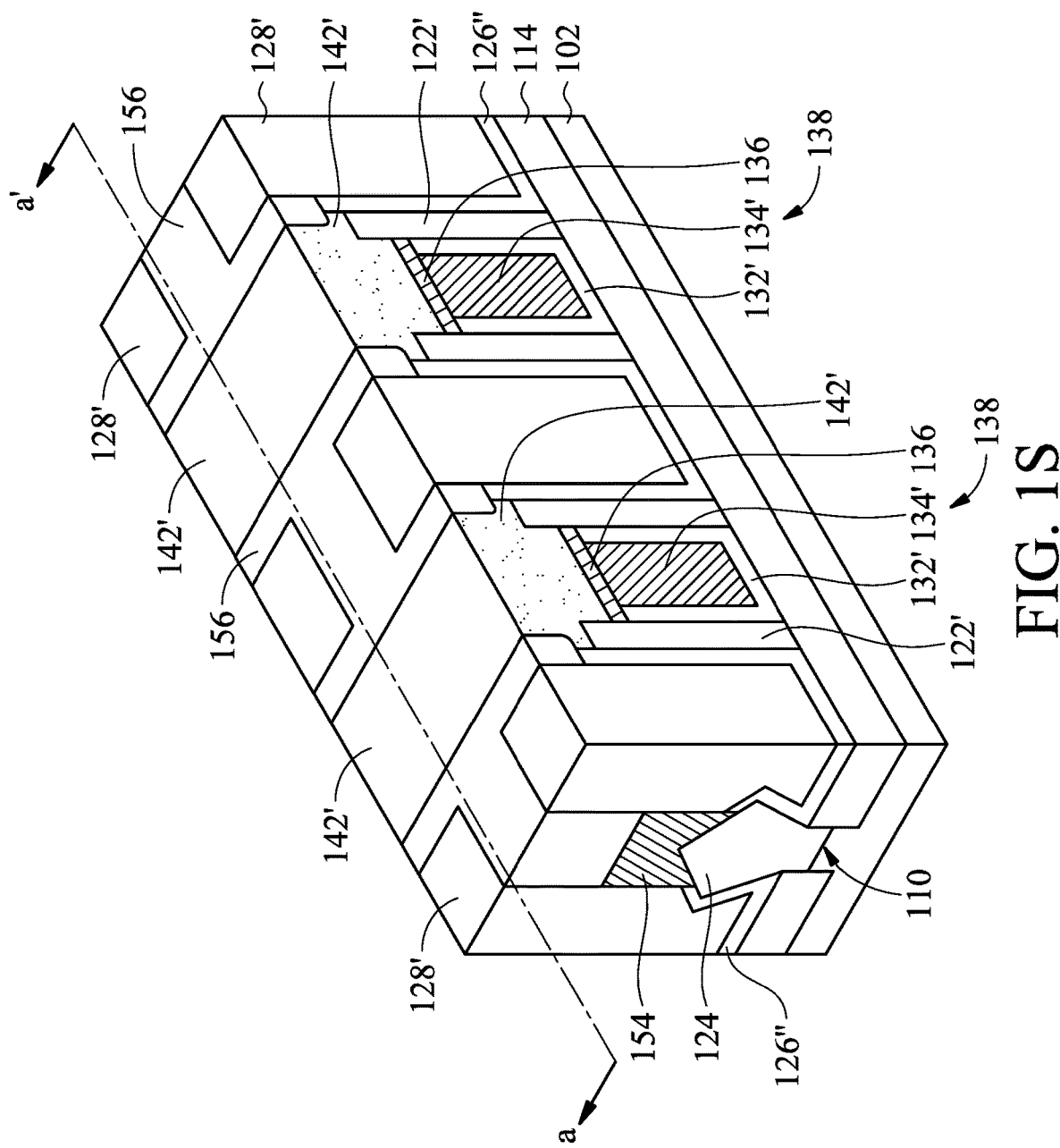
Figure 1T:
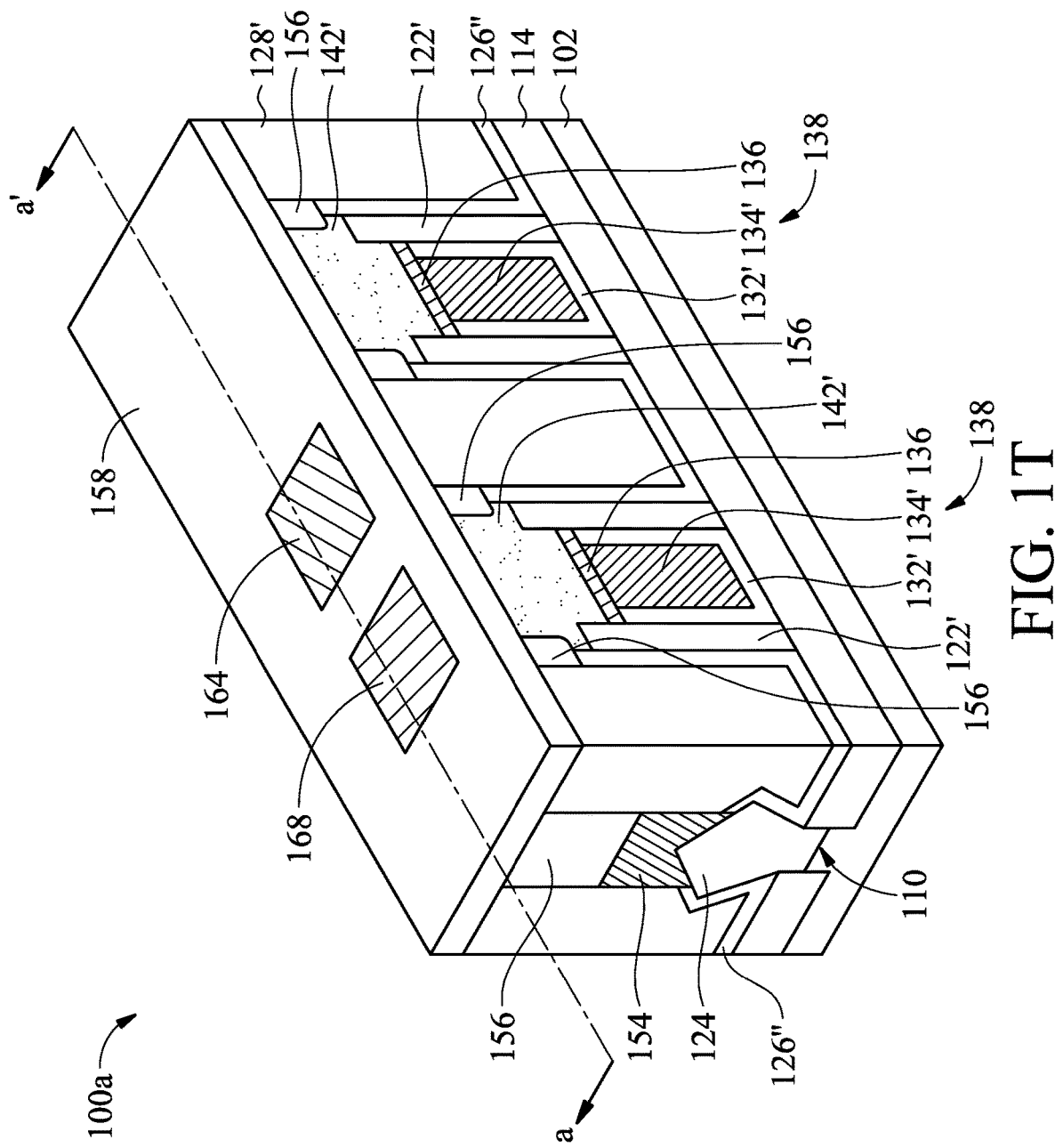

FIGS. 1A-1T are perspective representations of various stages of forming a FinFET device structure 100a, in accordance with some embodiments of the disclosure. FIGS. 2A-2H are cross-sectional representations of various stages of forming the FinFET device structure 100a shown in FIGS. 1M-1T, in accordance with some embodiments of the disclosure. FIGS. 2A-2H are cross-sectional representations taken along line a-a' of FIGS. 1M-1T.

A substrate 102 is provided, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a patterned photoresist layer 108 is formed over the mask layer 106, as shown in FIG. 1A in accordance with some embodiments. The patterned photoresist layer 108 may be formed by a deposition process and a patterning process.

The deposition process for forming the patterned photoresist layer 108 may include a chemical vapor deposition (CVD) process, a high-density plasma chemical vapor deposition (HDPCVD) process, a spin-on process, a sputtering process, or another applicable process. The patterning process for forming the patterned photoresist layer 108 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Moreover, the dielectric layer 104 may be a buffer layer between the substrate 102 and the mask layer 106. In some embodiments, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 may be formed by deposition processes, which may include a chemical vapor deposition (CVD) process, a high-density plasma chemical vapor deposition (HDPCVD) process, a spin-on process, a sputtering process, or another applicable process.

After the patterned photoresist layer 108 is formed, the dielectric layer 104 and the mask layer 106 are patterned by using the patterned photoresist layer 108 as a mask, as shown in FIG. 1B in accordance with some embodiments. As a result, a patterned dielectric layer 105 and a patterned mask layer 107 are obtained. Afterwards, the patterned photoresist layer 108 is removed.

Next, an etching process is performed on the substrate 102 to form a fin structure 110 by using the patterned dielectric layer 105 and the patterned mask layer 107 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

After the fin structure 110 is formed, an insulating layer 112 is formed to cover the fin structure 110, the patterned pad layer 105, and the patterned mask layer 107 over the substrate 102, as shown in FIG. 1C in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Next, the insulating layer 112 is thinned or planarized to expose the top surface of the patterned mask layer 107. In some embodiments, the insulating layer 112 is thinned by a chemical mechanical polishing (CMP) process. Afterwards, the patterned dielectric layer 105 and the patterned mask layer 107 are removed.

After the patterned dielectric layer 105 and the patterned mask layer 107 are removed, an upper portion of the insulating layer 112 is removed to form an isolation structure 114, as shown in FIG. 1D in accordance with some embodiments. The isolation structure 114 may be a shallow trench isolation (STI) structure surrounding the fin structure 110.

In some embodiments, a portion of the fin structure 110 is embedded in the isolation structure 114. More specifically, a lower portion of the fin structure 110 is surrounded by the isolation structure 114, while an upper portion of the fin structure 110 protrudes from the isolation structure 114. The isolation structure 114 is configured to prevent electrical interference or crosstalk.

After the isolation structure 114 is formed, dummy gate structures 120 are formed across the fin structure 110 and extend over the isolation structure 114, as shown in FIG. 1E in accordance with some embodiments. In some embodiments, each of the dummy gate structures 120 includes a dummy gate dielectric layer 116 and a dummy gate electrode layer 118 formed over the dummy gate dielectric layer 116. After the dummy gate structures 120 are formed, gate spacers 122 are formed on opposite sidewalls of each of the dummy gate structures 120. Each of the gate spacers 122 may be a single layer or multiple layers.

In order to improve the speed of the FinFET device structure 100a, the gate spacers 122 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the gate spacers 122 are made of an extreme low-k (ELK) dielectric material with a dielectric constant (k) less than about 2.5. In some embodiments, the ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

In addition, in some embodiments, the gate spacers 122 include air gaps (not shown) to further reduce their k value, such that the capacitances between the gate structures (formed subsequently) and the contacts (formed subsequently) electrically connected to the S/D structure (formed subsequently) may be reduced.

Afterwards, source/drain (S/D) structures 124 are formed over the fin structure 110, as shown in FIG. 1F in accordance with some embodiments. In some embodiments, portions of the fin structure 110 adjacent to the dummy gate structures 120 are recessed to form recesses at two sides of the fin structure 110, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

After the source/drain (S/D) structures 124 are formed, a contact etch stop layer (CESL) 126 is formed over the substrate 102, and an inter-layer dielectric (ILD) structure 128 is formed over the CESL 126. More specifically, the CESL 126 is formed over the S/D structures 124, the isolation structure 114, and the sidewalls of the gate spacers 122. In some embodiments, the CESL 126 is made of silicon nitride, silicon oxynitride, and/or other applicable materials. Moreover, the CESL 126 may be formed by plasma enhanced CVD, low-pressure CVD, atomic layer deposition (ALD), or other applicable processes.

In some embodiments, the ILD structure 128 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 128 may be formed by chemical vapor deposition (CVD), physical vapor deposition, (PVD), atomic layer deposition (ALD), spin-on coating, or another applicable process.

Afterwards, a planarizing process is performed on the ILD structure 128 until the top surfaces of the dummy gate structures 120 are exposed, as shown in FIG. 1G in accordance with some embodiments. After the planarizing process, the top surfaces of the dummy gate structures 120 may be substantially level with the top surfaces of the gate spacers 122 and the ILD structure 128. In some embodiments, the planarizing process includes a grinding process, a chemical mechanical polishing (CMP) process, an etching process, another applicable process, or a combination thereof.

Next, the dummy gate structures 120 are removed to form trenches 130 in the ILD structure 128, as shown in FIG. 1H in accordance with some embodiments. More specifically, each of the trenches 130 is formed between each pair of the gate spacers 122, and the fin structure 110 is exposed by the trenches 130. The dummy gate dielectric layer 116 and the dummy gate electrode layer 118 are removed by an etching process, such as a dry etching process or a wet etching process.

After the trenches 130 are formed, gate dielectric layers 132 and gate electrode layers 134 are formed in the trenches 130, as shown in FIG. 1I in accordance with some embodiments. More specifically, the gate electrode layers 134 are formed over the gate dielectric layers 132, and sidewalls of the gate electrode layers 132 may be covered by the gate dielectric layers 132. In addition, work function layers (not shown) may be formed between each of the gate dielectric layers 132 and each of the gate electrode layers 134.

Each of the gate dielectric layers 132 may be a single layer or multiple layers. In some embodiments, the gate dielectric layers 132 are made of silicon oxide, silicon nitride, silicon oxynitride (SiON), dielectric material(s) with high dielectric constant (high-k), or a combination thereof. In some embodiments, the gate dielectric layers 132 are deposited by a plasma enhanced chemical vapor deposition (PECVD) process or a spin coating process.

Moreover, the gate electrode layers 134 are made of a conductive material such as aluminum (Al), copper (Cu), tungsten (W), titanium (Ti), tantalum (Ta), or another applicable material, in accordance with some embodiments. The gate electrode layers 134 may be formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

The work function layers may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

After the gate dielectric layers 132 and gate electrode layers 134 are formed, the top portions of the gate spacers 122, the top portions of the gate dielectric layers 132 and the top portions of the gate electrode layers 134 are removed, as shown in FIG. 1J in accordance with some embodiments. In some embodiments, the top portions of the gate dielectric layers 132 and the top portions of the gate electrode layers 134 are removed by a single etching process or multiple etching processes, such as dry etching processes. The dry etching processes may include plasma etching processes. Moreover, the top portions of the gate spacers 122 may be removed by a single etching process or multiple etching processes, such as dry etching processes.

As a result, the top surface of the CESL 126 is higher than the top surfaces of the remaining gate spacers 122', and the top surfaces of the remaining gate spacers 122' are higher than the top surfaces of the remaining gate dielectric layers 132' and the top surfaces of the remaining gate electrode layers 134'. In addition, openings 140 above the remaining gate spacers 122', the remaining gate dielectric layers 132' and the remaining gate electrode layers 134' are obtained.

Afterwards, metal cap layers 136 are formed in the openings 140 and covering the remaining gate dielectric layers 132' and the remaining gate electrode layers 134', such that the remaining openings 140' above gate structures 138 are obtained, as shown in FIG. 1K in accordance with some embodiments. Each of the gate structures 138 includes one of the metal cap layers 136, one of the remaining gate electrode layers 134', and one of the remaining gate dielectric layers 132'. In some embodiments, the top surfaces of the remaining gate spacers 122' are higher than the top surfaces of the gate structures 138. In some other embodiments, the top surfaces of the gate spacers 122' may be substantially level with the top surfaces of the gate structures 138.

Next, a first hard mask material 142 is formed in the remaining openings 140' and over the remaining gate spacers 122' and the gate structures 138, as shown in FIG. 1L in accordance with some embodiments. In some embodiments, a top portion of the CESL 126 is removed such that a remaining CESL 126' is obtained, and the top surface of the first hard mask material 142 is substantially level with the top surface of the remaining CESL 126'.

More specifically, a mask material (not shown) is filled in the remaining openings 140', and a planarization process, such as a grinding process, a chemical mechanical polishing (CMP) process, or an etching process is performed to expose the top surface of the ILD structure 128. Then, the mask material and the CESL 126 are recessed to form the first hard mask material 142 and the remaining CESL 126'. Moreover, reduced openings 140" above the first hard mask material 142 and the remaining CESL 126' are obtained.

In some embodiments, the first hard mask material 142 is made of oxide, silicon oxide, silicon nitride, silicon carbonitride (SiCN), silicon oxide carbonitride (SiOCN), SiLK, or a combination thereof. In some embodiments, the first hard mask material 142 is formed by deposition process, such as a chemical vapor deposition (CVD) process, an atomic layer deposition (ALD) process, or another applicable process. In addition, the first hard mask material 142 may be a single layer which is formed by a single deposition process, or multiple layers which are formed by multiple deposition processes.

Figure 2A:
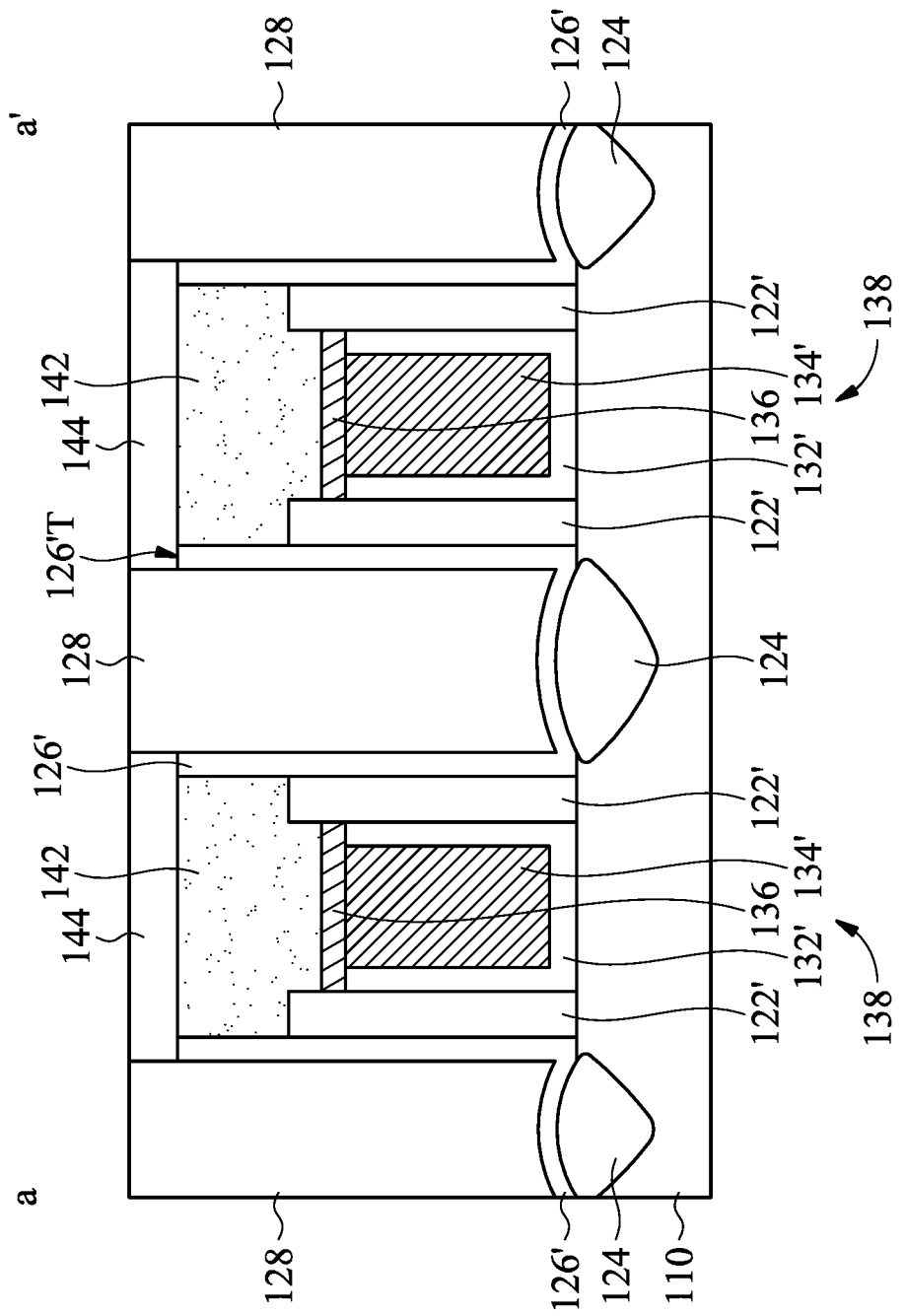
FIGS. 2A-2H are cross-sectional representations of various stages of forming a FinFET device structure shown in FIGS. 1M-1T, in accordance with some embodiments of the disclosure.

After the first hard mask material 142 is formed, a temporal hard mask material 144 is filled in the reduced openings 140", as shown in FIGS. 1M and 2A in accordance with some embodiments. In some embodiments, the temporal mask material 144 adjoins the ILD structure 128, and the top surface 126'T of the remaining CESL 126' is covered by the temporal hard mask material 144.

In some embodiments, the temporal hard mask material 144 is made of oxide, silicon oxide, silicon nitride, silicon carbonitride (SiCN), silicon oxide carbonitride (SiOCN), SiLK, or a combination thereof. It should be noted that the material of the first hard mask material 142 is different from the material of the temporal hard mask material 144 in accordance with some embodiments. In addition, the temporal hard mask material 144 may be formed by deposition process, such as a chemical vapor deposition (CVD) process, an atomic layer deposition (ALD) process, or another applicable process.

Figure 2B:
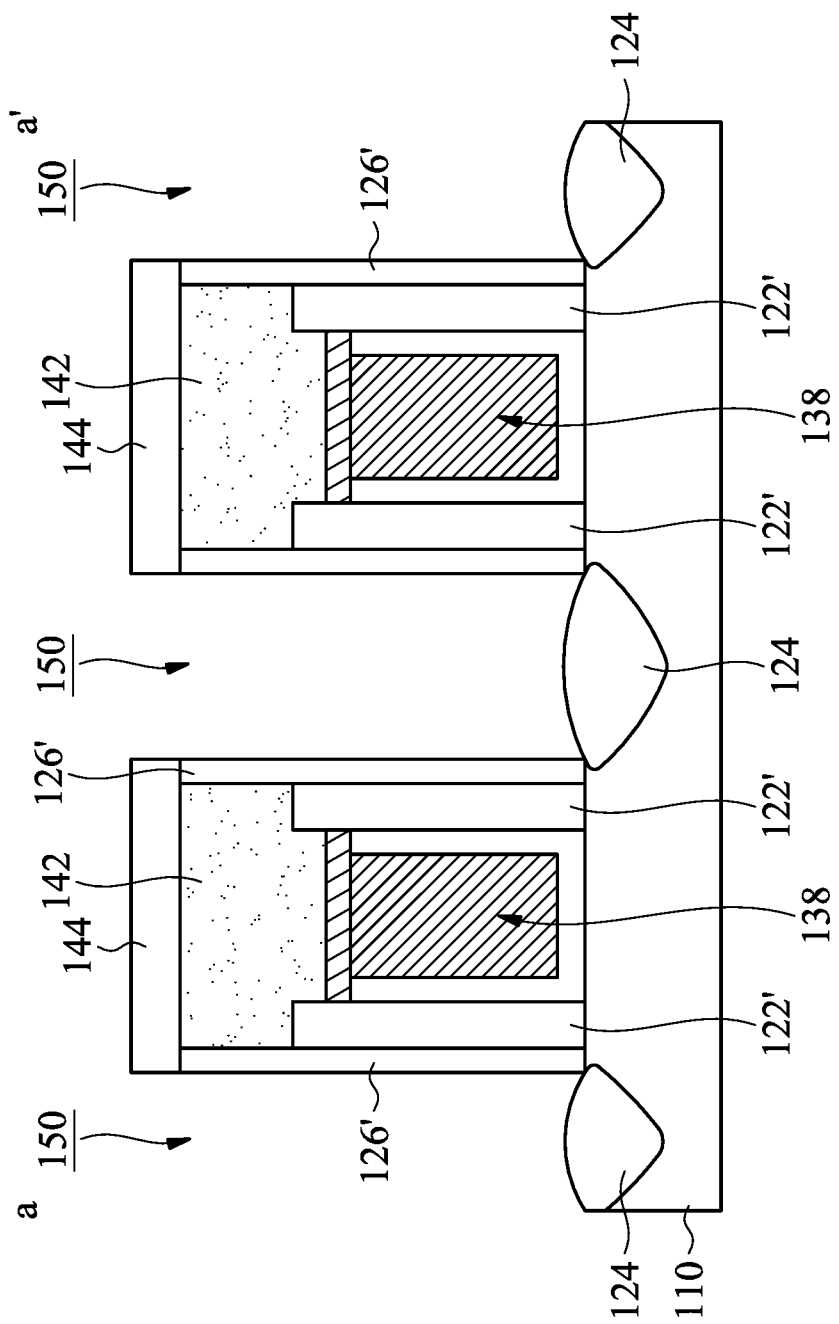

After the temporal hard mask material 144 is formed, a portion of the ILD structure 128 is removed to form contact openings 150, as shown in FIGS. 1N and 2B in accordance with some embodiments. Specifically, the ILD structure 128 and the remaining CESL 126' are partially removed by an etching process, such as a dry etching process. As a result, a portion of each of the S/D structures 124 is exposed by each of the contact openings 150.

It should be noted that the etching selectivity of the ILD structure 128 with respect to the temporal hard mask material 144 is high. Therefore, the etching process for forming the contact openings 150 is a self-aligned etching process. More specifically, the portion of the ILD structure 128 is removed by the etching process while the temporal hard mask material 144 is not removed.

Since the first hard mask material 142 and the gate structures 138 are protected by the temporal hard mask material 144, the gate structures 138 are not damaged by the etchant during the etching process for forming the contact openings 150. As a result, the sidewalls of the temporal hard mask material 144 and the sidewalls of the remaining CESL 126' are partially exposed by the contact openings 150.

Figure 2C:
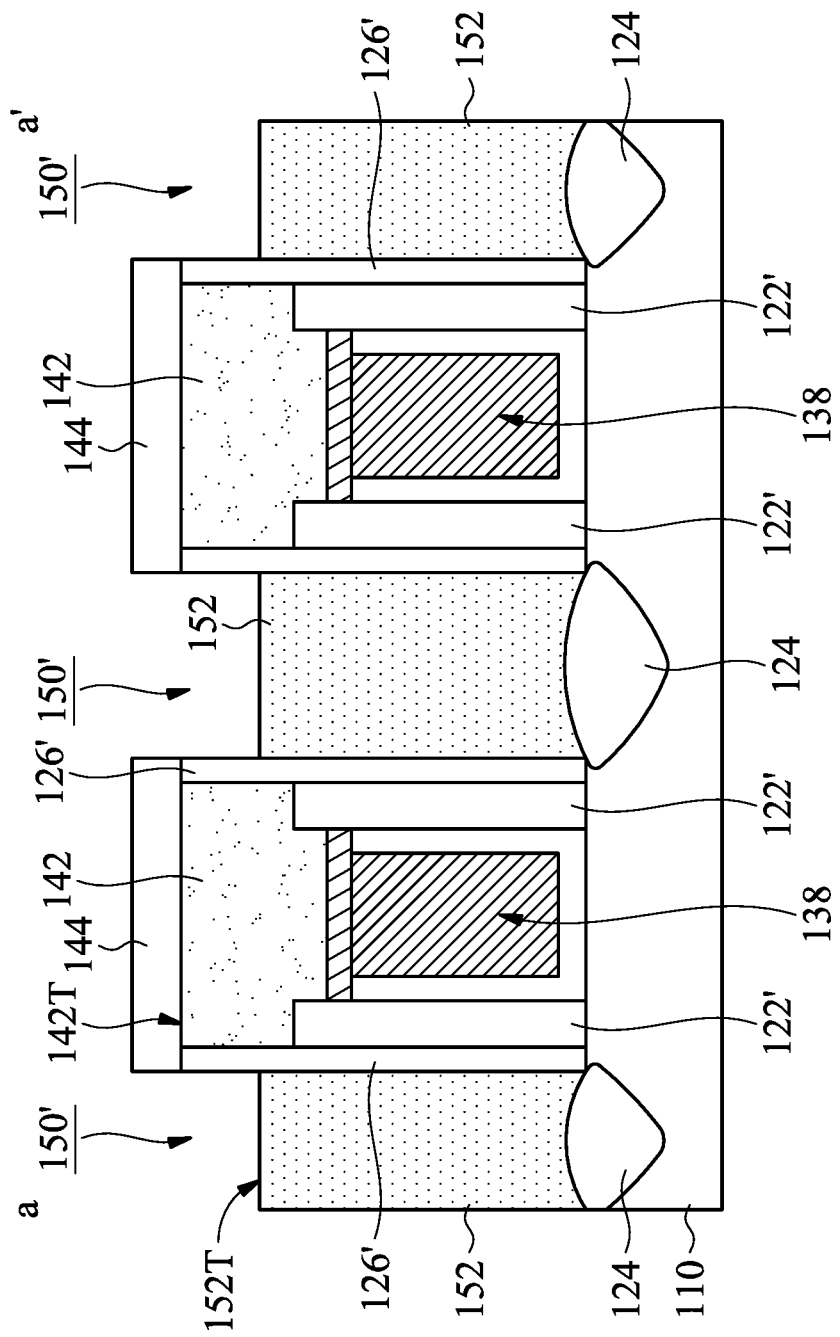

Next, a sacrificial layer 152 is formed in the contact openings 150, as shown in FIGS. 1O and 2C in accordance with some embodiments. More specifically, the contact openings 150 are filled by a sacrificial material (not shown). Then, a top portion of the sacrificial material is removed to form the sacrificial layer 152, and the top surface 152T of the sacrificial layer 152 is lower than the top surface 142T of the first hard mask material 142. Moreover, reduced contact openings 150' above the sacrificial layer 152 are obtained, and the interface between the temporal hard mask material 144 and the remaining CESL 126' is exposed by the reduced contact openings 150'.

In some embodiments, the sacrificial layer 152 is made of a bottom anti-reflective coating (BARC) material, which includes a polymer material or a resist material. For example, the sacrificial layer 152 may be made of t-Butyloxycarbonyl (t-BOC) resist, acetal resist, environmentally stabilized chemically amplified photoresist (ESCAP), or another applicable material. In some other embodiments, the sacrificial layer 152 may include dielectric materials such as silicon oxide, silicon nitride, or silicon oxynitride. In addition, the sacrificial material may be filled in the contact openings 150 by a deposition process.

Figure 2D:
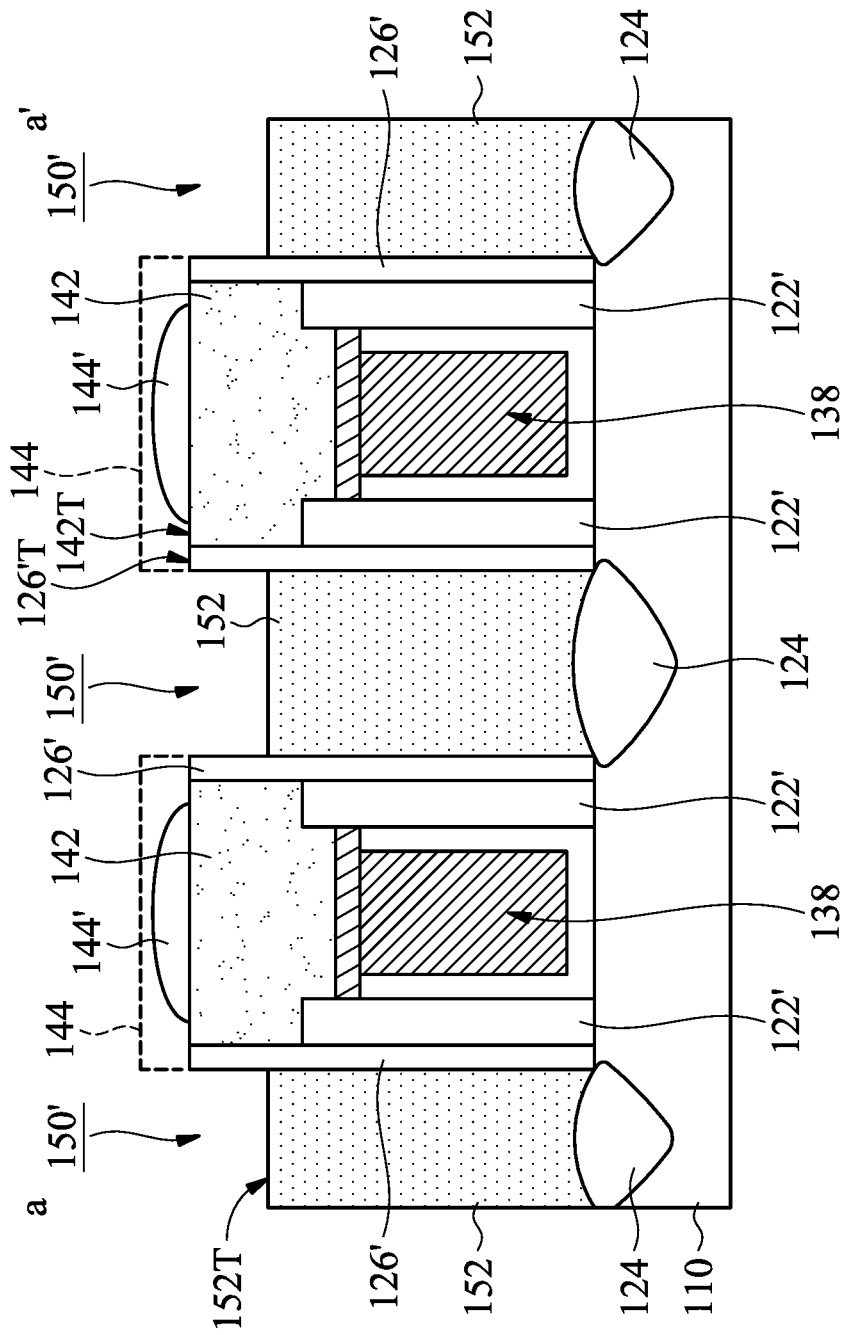

After the sacrificial layer 152 is formed, the temporal hard mask material 144 is trimmed by an etching process such that a temporal hard mask layer 144' is formed, as shown in FIGS. 1P and 2D in accordance with some embodiments. More specifically, the size of the temporal hard mask layer 144' is smaller than the size of the temporal hard mask material 144, such that the top surface 126'T of the remaining CESL 126' is exposed by the temporal hard mask layer 144', and the top surface 142T of the first hard mask material 142 is partially exposed by the temporal hard mask layer 144'.

In some embodiments, the etching process for forming the temporal hard mask layer 144' is a dry etching process or a wet etching process. After the etching process, the temporal hard mask layer 144' has a curved surface (e.g. a convex top surface) in accordance with some embodiments. In some embodiments, the height of the temporal hard mask material 144 is reduced after the etching process is performed.

Figure 2E:
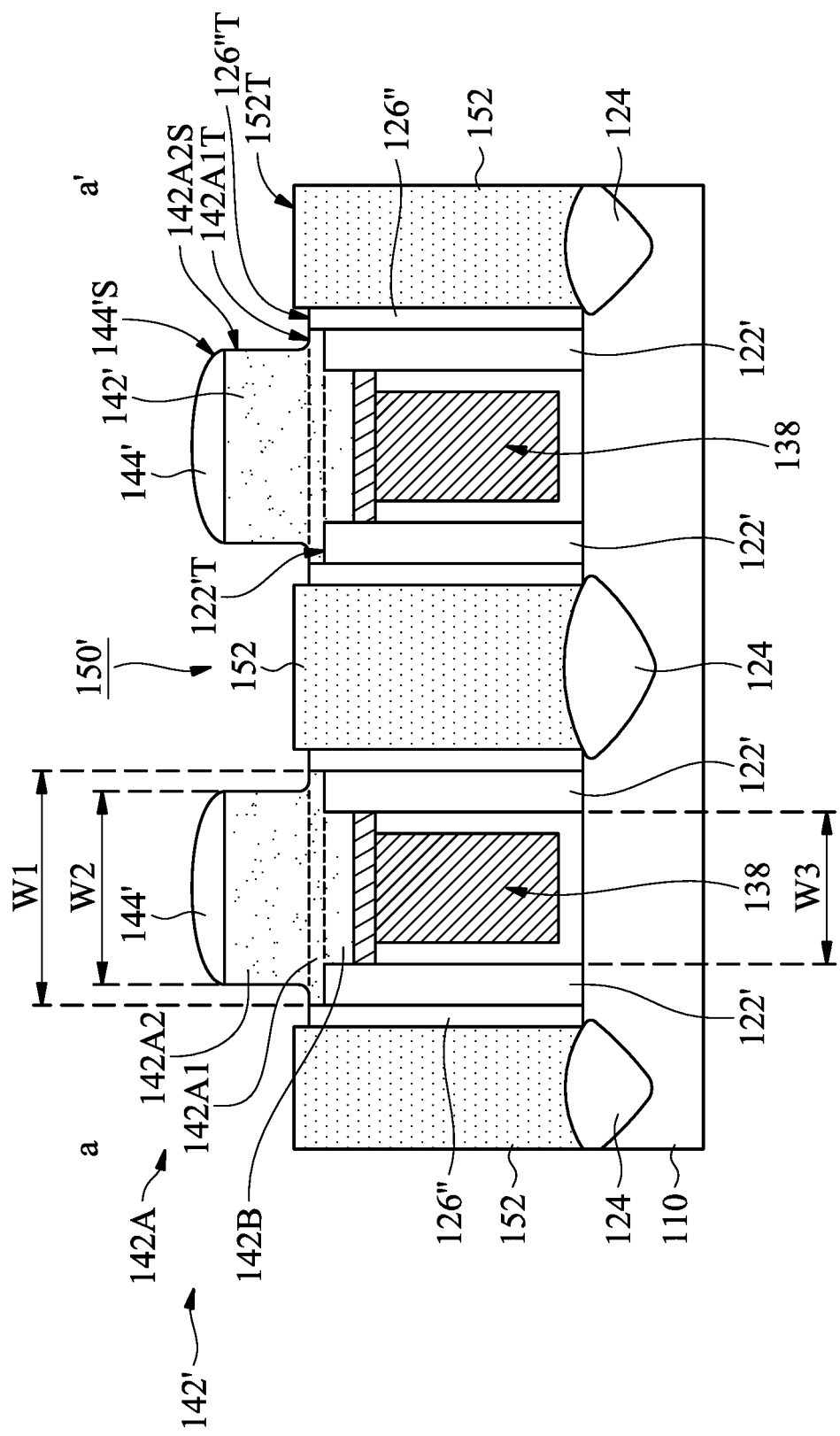

Next, a portion of the first hard mask material 142 and a portion of the remaining CESL 126' are removed by using the temporal hard mask layer 144' as a mask to form a first hard mask layer 142' and a reduced CESL 126", as shown in FIGS. 1Q and 2E in accordance with some embodiments. In some embodiments, the portion of the first hard mask material 142 and the portion of the remaining CESL 126' are removed by performing an etching process, such as a dry etching process or a wet etching process. It should be noted that the depth of the removed portion of the first hard mask material 142 is controlled by the height of the sacrificial layer 152.

More specifically, after the portion of the first hard mask material 142 is removed, the first hard mask layer 142' is formed, and the first hard mask layer 142' includes an upper portion 142A above the remaining gate spacers 122' and a lower portion 142B between the upper portion 142A and the gate structures 138. Moreover, the upper portion 142A may include a first portion 142A1 and a second portion 142A2 above the first portion 142A1, and the upper portion 142A of the first hard mask layer 142' has an inverted-T shape. It should be noted that the inverted-T shape is constructed by the first portion 142A1 and a second portion 142A2 of the upper portion 142A of the first hard mask layer 142'.

In some other embodiments, the top surface 122'T of the remaining gate spacers 122 is substantially level with the top surface of the gate structures 138, the first hard mask layer 142' is located entirely above the remaining gate spacers 122'. Therefore, in this case, the first hard mask layer 142' may not include the lower portion 142B, and the inverted-T shape is constructed by the entire first hard mask layer 142'.

In some embodiments, the sidewalls 144'S of the temporal hard mask layer 144' is coplanar with the sidewalls 142A2S of the second portion 142A2 of the first hard mask layer 142', and the sidewalls 144'S and the sidewalls 142A2S are directly above the remaining gate spacers 122'. In some other embodiments, the sidewalls 144'S and the sidewalls 142A2S may be directly above the gate structures 138. In addition, in some embodiments, the top surface 142A1T of the first portion 142A1 of the first hard mask layer 142' is substantially level with the top surface 126"T of the reduced CESL 126", and both of the top surface 142A1T and the top surface 126"T are higher than the top surface 122'T of the remaining gate spacers 122'.

Moreover, the first portion 142A1 of the first hard mask layer 142' has a first width W1, the second portion 142A2 of the first hard mask layer 142' has a second width W2, and the lower portion 142B of the first hard mask layer 142' has a third width W3. In some embodiments, the first width W1 is greater than the second width W2, and the second width W2 is greater than the third width W3.

Figure 2F:
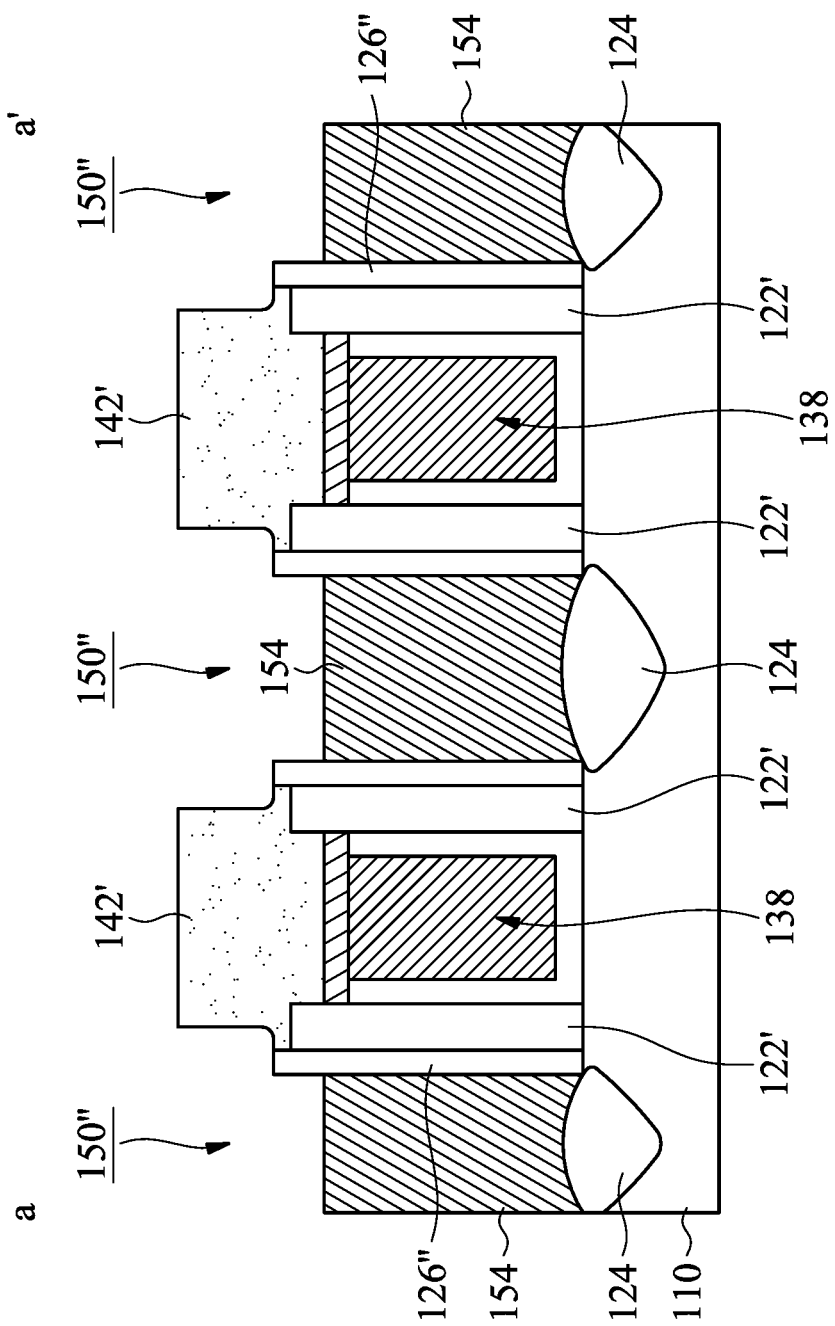

Afterwards, the sacrificial layer 152 is replaced by contacts 154, and the temporal hard mask layer 144' is removed such that the first hard mask layer 142' is exposed, as shown in FIGS. 1R and 2F in accordance with some embodiments. It should be noted that the contacts 154 are electrically connected to the S/D structures 124.

In some embodiments, the sacrificial layer 152 is replaced by a conductive material (not shown). Then, a planarization process, such as a chemical mechanical polishing (CMP) process, is performed on the conductive material, the temporal hard mask layer 144' and the ILD structure 128, such that the temporal hard mask layer 144' is removed, and a top portion of the ILD structure 128 is removed to form a remaining ILD structure 128'. Afterwards, the conductive material is recessed to form contacts 154, and openings 150" above the contacts 154 are obtained.

In some embodiments, the contacts 154 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another applicable material. In some embodiments, the contacts 154 are formed by a deposition process, a planarization process and an etching process. The deposition process may include a chemical vapor deposition (CVD) process, a physical vapor deposition (PVD) process, an atomic layer deposition (ALD) process, a plating process, or another applicable process.

Figure 2G:
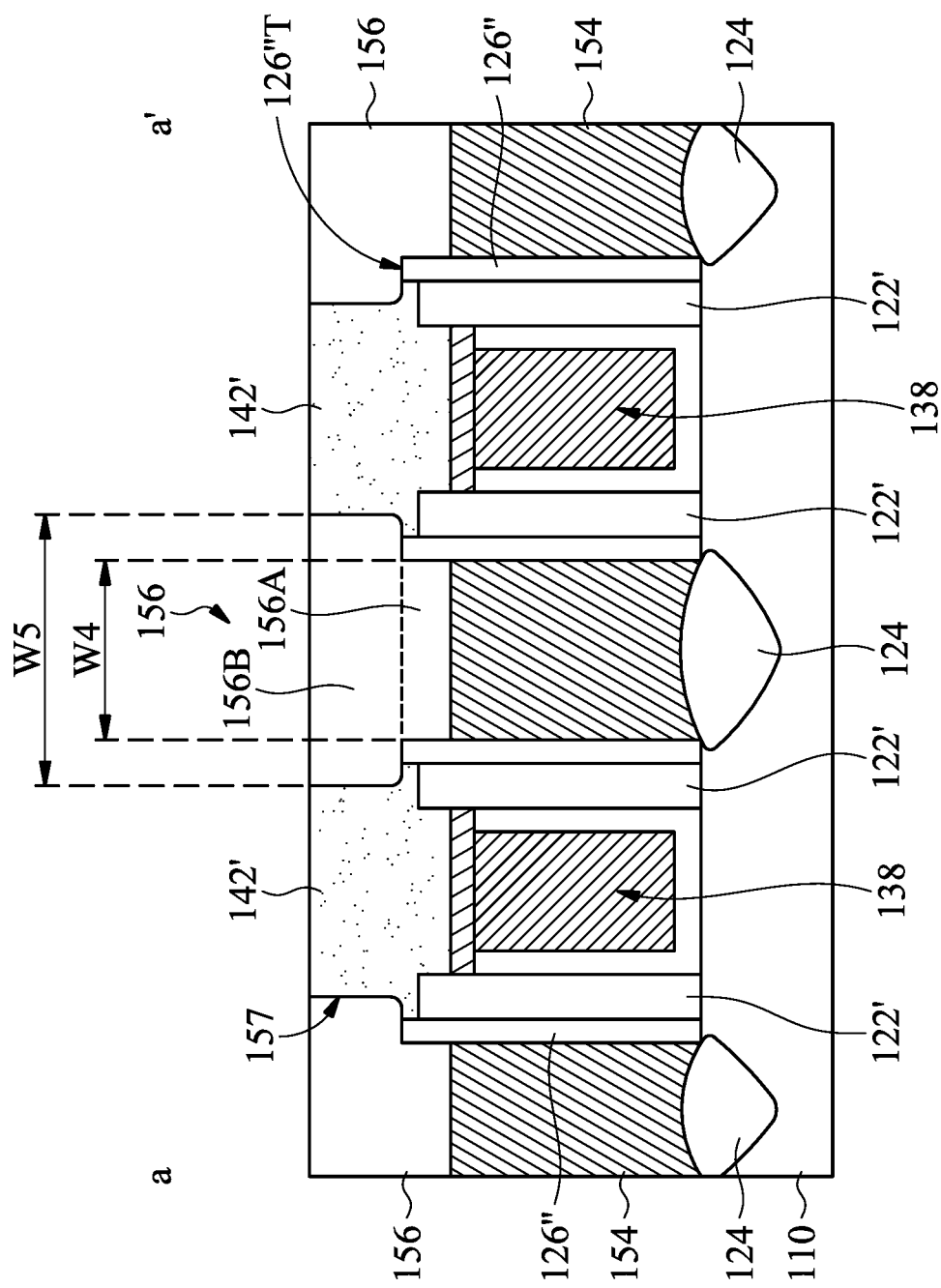

After the contacts 154 are formed and the temporal hard mask layer 144' is removed, a second hard mask layer 156 is filled in the openings 150" above the contacts 154, as shown in FIGS. 1S and 2G in accordance with some embodiments. In some embodiments, the second hard mask layer 156 includes a lower portion 156A and an upper portion 156B above the lower portion 156A. It should be noted that the upper portion 156B of the second hard mask layer 156 covers a part of the first portion 142A1 of the first hard mask layer 142', and the part of the first portion 142A1 is interposed between the second hard mask layer 156 and the remaining gate spacers 122'.

In some embodiments, the upper portion 156B of the second hard mask layer 156 covers the top surface 126"T of the reduced CESL 126", and the second hard mask layer 156 has a T shape. It should be noted that the T shape is constructed by the upper portion 156B and the lower portion 156A of the second hard mask layer 156.

In some embodiments, the interface 157 between the first hard mask layer 142' and the second hard mask layer 156 is directly above the remaining gate spacers 122'. In some other embodiments, the interface 157 between the first hard mask layer 142' and the second hard mask layer 156 may be directly above the gate structures 138.

Moreover, the lower portion 156A of the second hard mask layer 156 has a fourth width W4, and the upper portion 156B of the second hard mask layer 156 has a fifth width W5. In some embodiments, the fifth width W5 is greater than the fourth width W4. In addition, the material of the second hard mask layer 156 is different from the material of the first hard mask layer 142' in accordance with some embodiments.

In some embodiments, the second hard mask layer 156 is made of oxide, silicon oxide, silicon nitride, silicon carbonitride (SiCN), silicon oxide carbonitride (SiOCN), SiLK, or a combination thereof. In some embodiments, the second hard mask layer 156 is formed by deposition process, such as a chemical vapor deposition (CVD) process, an atomic layer deposition (ALD) process, or another applicable process.

Moreover, the second hard mask layer 156 may be a single layer which is formed by a single deposition process, or multiple layers which are formed by multiple deposition processes. For example, the second hard mask layer 156 may include a first sub-layer (not shown) and a second sub-layer (not shown), and the bottom surface and the sidewalls of the second sub-layer are covered by the first sub-layer.

In this case, the first sub-layer may be made of silicon, nitride, silicon nitride or another applicable material, and the first sub-layer may be formed by a deposition process, such as an atomic layer deposition (ALD) process or another applicable process. Moreover, the second sub-layer may be made of oxide, silicon oxide or another applicable material, and the second sub-layer may be formed by a deposition process, such as a chemical vapor deposition (CVD) process or another applicable process.

Figure 2H:
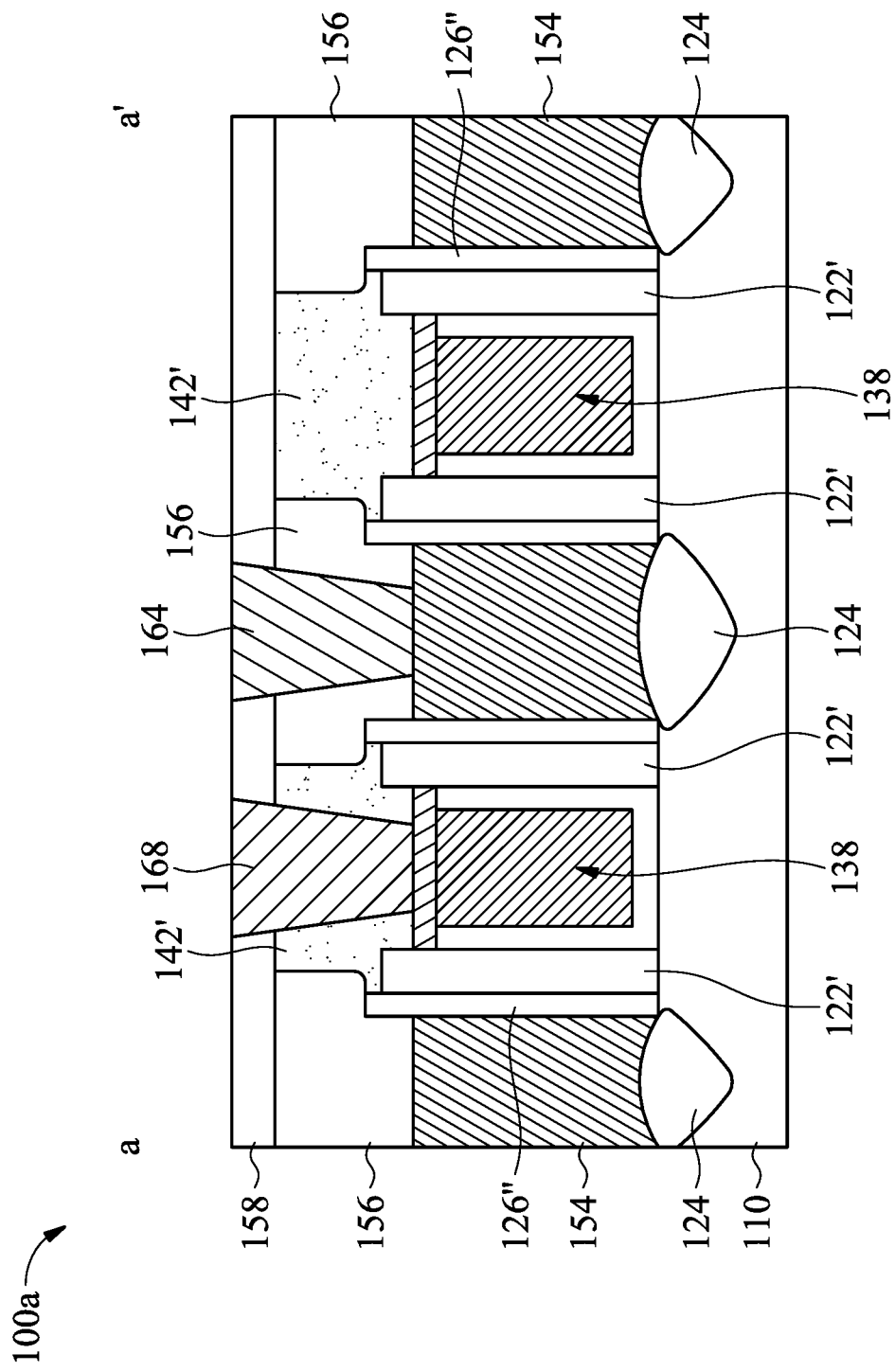

After the second hard mask layer 156 is formed, an etch stop layer (ESL) 158 is formed over the first hard mask layer 142' and the second hard mask layer 156, a first conductive plug 168 is formed penetrating through the ESL 158 and the first hard mask layer 142', and a second conductive plug 164 is formed penetrating through the ESL 158 and the second hard mask layer 156, as shown in FIGS. 1T and 2H in accordance with some embodiments.

In some embodiments, the ESL 158 is made of silicon carbide (SiC), silicon nitride (SiN), aluminum oxide, silicon carbonitride (SiCN), silicon oxycarbide (SiOC), silicon oxycarbon nitride (SiOCN) or another applicable material. In some embodiments, the ESL 158 is formed by performing a plasma enhanced chemical vapor deposition (CVD) process, a low pressure CVD process, an atomic layer deposition (ALD) process, or another applicable process.

More specifically, a first opening (not shown) may be formed penetrating through the ESL 158 and the first hard mask layer 142' and exposing a portion of the gate structures 138, and a second opening (not shown) may be formed penetrating through the ESL 158 and the second hard mask layer 156 and exposing a portion of the contacts 154. The first opening and the second opening may be independently or simultaneously formed by a self-aligned etching process.

Next, the first conductive plug 168 is formed in the first opening, and the second conductive plug 164 is formed in the second opening. In some embodiments, the first conductive plug 168 and the second conductive plug 164 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another applicable material.

In some embodiments, the first conductive plug 168 and the second conductive plug 164 are independently formed by a deposition process, such as a chemical vapor deposition (CVD) process, physical vapor deposition (PVD) process, atomic layer deposition (ALD) process, plating process or another applicable process. In some other embodiments, the first conductive plug 168 and the second conductive plug 164 are simultaneously formed by a deposition process.

In addition, the first conductive plug 168 is electrically connected to the gate structures 138, and the second conductive plug 164 is electrically connected to the S/D structures 124 through the contacts 154. It should be noted that, since the first conductive plug 168 and the second conductive plug 164 are formed by self-aligned etching processes, the location of the first conductive plug 168 may be controlled in the region of the first hard mask layer 142', and the location of the second conductive plug 164 may be controlled in the region of the second hard mask layer 156.

If the upper portion 142A of the first hard mask layer 142' over the remaining gate spacers 122' is T-shaped instead of inverted T-shaped, and the second hard mask layer 156 does not extend directly above the gate spacers 122', the location of the first conductive plug 168 may be shifted such that a portion of the first conductive plug 168 may be directly above the contacts 154, and the location of the second conductive plug 164 may be shifted in such a way that a portion of the second conductive plug 164 is directly above the gate structures 138. Therefore, the gate structures 138 and the contacts 154 may not be isolated perfectly.

In some embodiments of the present disclosure, the upper portion 142A of the first hard mask layer 142' over the remaining gate spacers 122' has an inverted-T shape, and a portion of the second hard mask layer 156 is directly above the gate spacers 122'. Therefore, the locations of the first conductive plug 168 and the second conductive plug 164 may be well controlled. As a result, the isolation between the gate structures 138 and the contacts 154 may be secured.

Figure 3:
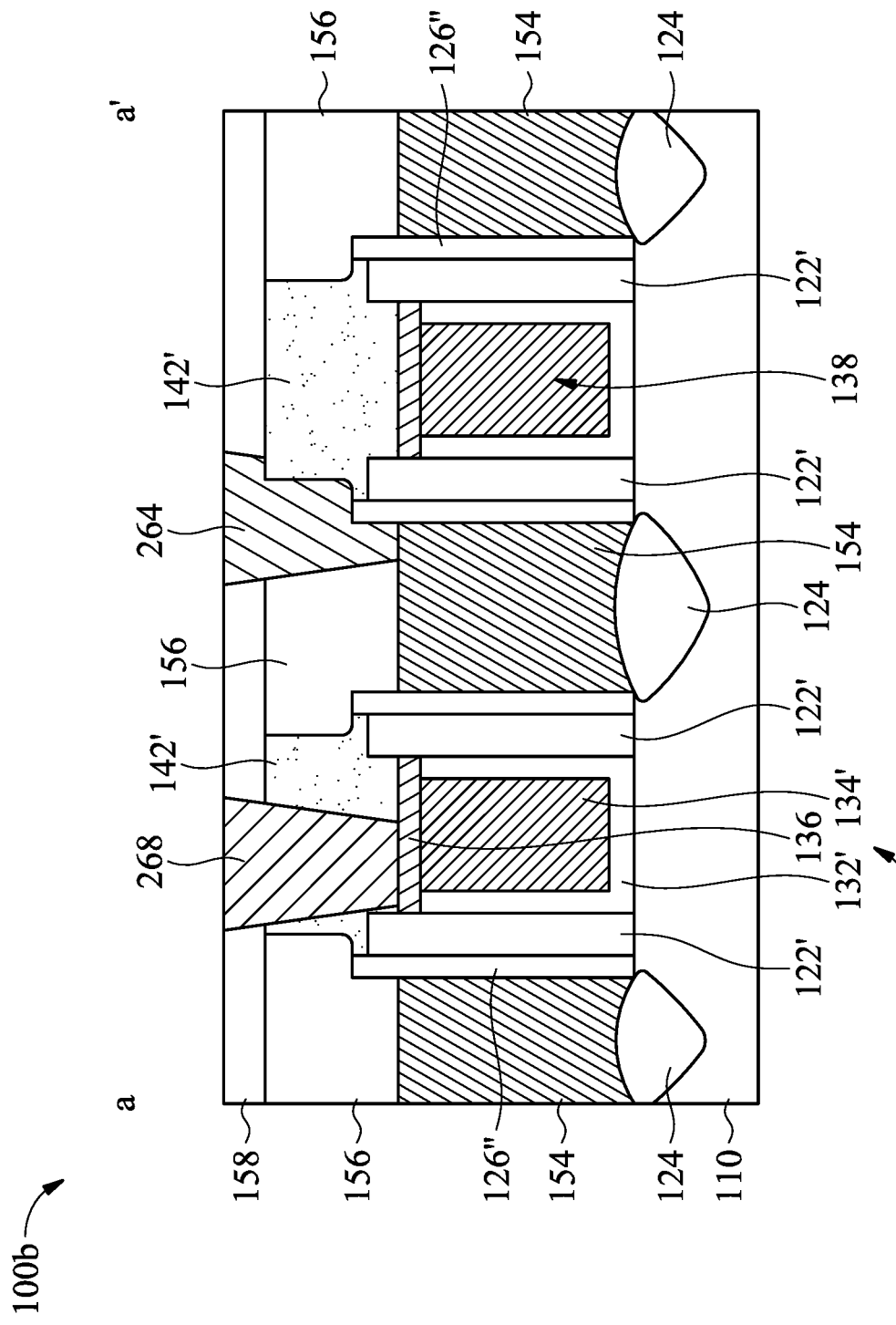
FIG. 3 is a cross-sectional representation of a modified FinFET device structure, in accordance with some embodiments of the disclosure.

FIG. 3 is a cross-sectional representation of a modified FinFET device structure 100b, in accordance with some embodiments of the disclosure. The FinFET device structure 100b is similar to the FinFET device structure 100a of FIG. 2H, and the difference between FIG. 3 and FIG. 2H is that the locations of the first conductive plug 168 and the second conductive plug 164 are slightly shifted in FIG. 3.

Some processes and materials used to form the first conductive plug 268 and the second conductive plug 264 of FIG. 3 are similar to, or the same as, those used to form the first conductive plug 168 and the second conductive plug 164 of FIG. 2H and are not repeated herein.

In some embodiments, the upper portion 142A of the first hard mask layer 142' has an inverted-T shape, and the second hard mask layer 156 is T-shaped and extends directly above the gate spacers 122'. Even if the first conductive plug 268 and the second conductive plug 264 are slightly shifted, the isolation between the gate structures 138 and the contacts 154 can still be secured. In some other embodiments, it is ensured that the gate structures 138 are isolated from the contacts 154 even if the gate spacers 122' include air gaps to further reduce their k value.

Embodiments of a FinFET device structure and method for forming the same are provided. The FinFET device structure includes a first hard mask layer having an inverted-T shape over a gate structure, and a second hard mask layer having a T shape over a contact electrically connected to an S/D structure. A gate spacer is formed between the gate structure and the contact. Since a portion of the second hard mask layer is directly above the gate spacer, a conductive plug formed afterwards penetrating through the first hard mask layer and electrically connecting to the gate structure may be prevented from being shifted to a location directly above the contact. Therefore, the isolation between the gate structure and the contact may be secured.

In some embodiments, a FinFET device structure is provided. The FinFET device structure includes a fin structure formed over a substrate and gate structure formed over the fin structure. The FinFET device structure also includes a contact formed over the fin structure and adjacent to the gate structure. The FinFET device structure further includes a first hard mask layer formed over the gate structure, and an upper portion of the first hard mask layer has an inverted-T shape. In addition, the FinFET device structure includes a second hard mask layer formed over the contact, and the second hard mask layer has a T shape.

In some embodiments, a FinFET device structure is provided. The FinFET device structure includes a fin structure formed over a substrate and gate structure formed over the fin structure. The FinFET device structure also includes a contact formed over the fin structure and adjacent to the gate structure. The FinFET device structure further includes a first hard mask layer formed over the gate structure, and a second hard mask layer formed over the contact. In addition, the FinFET device structure includes a gate spacer formed on a sidewall of the gate structure, and a portion of the second hard mask layer is directly above the gate spacer.

In some embodiments, a method for forming a FinFET device structure is provided. The method for forming a FinFET device structure includes forming a fin structure over a substrate, and forming a gate structure over the fin structure. The method for forming a FinFET device structure also includes forming a first hard mask material over the gate structure, and removing a portion of the first hard mask material by using a temporal hard mask layer as a mask to form a recess in a first hard mask layer. The method for forming a FinFET device structure further includes forming a contact over the fin structure, and forming a second hard mask layer over the contact and extending into the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
   forming a fin structure over a substrate;
   forming a gate structure over the fin structure;
   forming a first hard mask material over the gate structure;
   removing a portion of the first hard mask material by using a temporal hard mask layer as a mask to form a recess in a first hard mask layer;
   forming a contact over the fin structure; and
   forming a second hard mask layer over the contact and extending into the recess.

2. The method for forming the fin field effect transistor (FinFET) device structure as claimed in claim 1, wherein forming the first hard mask layer comprises:

forming a temporal hard mask material over the first hard mask material, wherein a material of the temporal hard mask material is different from a material of the hard mask material; and removing a portion of the temporal hard mask material to form the temporal hard mask layer.

3. The method for forming the fin field effect transistor (FinFET) device structure as claimed in claim 1, further comprising:

forming a gate spacer on a sidewall of the gate structure, wherein a portion of the second hard mask layer is directly above the gate spacer.

4. The method for forming the fin field effect transistor (FinFET) device structure as claimed in claim 3, further comprising:

forming a contact etch stop layer (CESL) on a sidewall of the gate spacer, wherein a top surface of the CESL is exposed after the temporal hard mask layer is formed.

5. The method for forming the fin field effect transistor (FinFET) device structure as claimed in claim 3, wherein a sidewall of the temporal hard mask layer is directly above the gate spacer.

6. The method for forming the fin field effect transistor (FinFET) device structure as claimed in claim 1, further comprising:

forming a source/drain (S/D) structure over the fin structure and adjacent to the gate structure;
forming an opening exposing the S/D structure;
forming a sacrificial layer in the opening; and
removing a portion of the sacrificial layer before the temporal hard mask layer is formed, such that a top surface of the sacrificial layer is lower than a top surface of the first hard mask material.

7. The method for forming the fin field effect transistor (FinFET) device structure as claimed in claim 6, further comprising:

removing the sacrificial layer and the temporal hard mask layer after the first hard mask layer is formed, wherein the contact is formed in the opening after the sacrificial layer is removed.

8. A method for forming a fin field effect transistor (FinFET) device structure, comprising:

forming a fin structure over a substrate;
forming a gate structure over the fin structure;
forming a gate spacer on a sidewall of the gate structure;
forming a first hard mask layer over the gate structure;
forming a recess in the first hard mask layer, wherein the recess is located over a portion of the gate spacer;
forming a contact over the fin structure; and
forming a second hard mask layer over the contact and extending into the recess.

9. The method for forming the fin field effect transistor (FinFET) device structure as claimed in claim 8, further comprising:

forming a contact etch stop layer (CESL) on a sidewall of the gate spacer, wherein after the recess is formed, a top surface of the CESL is exposed by the recess.

10. The method for forming the fin field effect transistor (FinFET) device structure as claimed in claim 9, further comprising:

forming an opening exposing the gate structure, wherein after the opening is formed, a top surface of the CESL is higher than a top surface of the gate spacer.

11. The method for forming the fin field effect transistor (FinFET) device structure as claimed in claim 10, further comprising:

forming a metal cap layer in the opening, wherein the top surface of the gate spacer is higher than a top surface of the metal cap layer.

12. The method for forming the fin field effect transistor (FinFET) device structure as claimed in claim 8, further comprising:

forming an inter-layer dielectric (ILD) structure over the fin structure, wherein a sidewall of the ILD structure is exposed by the recess.

13. The method for forming the fin field effect transistor (FinFET) device structure as claimed in claim 8, further comprising:

forming a first conductive plug penetrating through the first hard mask layer and electrically connected to the gate structure;
forming a source/drain (S/D) structure between the fin structure and the contact; and
forming a second conductive plug penetrating through the second hard mask layer and electrically connected to the S/D structure through the contact.

14. The method for forming the fin field effect transistor (FinFET) device structure as claimed in claim 8, wherein forming the first hard mask layer comprises:

forming a first hard mask material over the gate structure, wherein the first hard mask material covers the gate spacer; and
forming a temporal hard mask material over the first hard mask material.

15. The method for forming the fin field effect transistor (FinFET) device structure as claimed in claim 14, further comprising:

removing a portion of the temporal hard mask material, wherein after the portion of the temporal hard mask material is removed, a portion of the first hard mask material is exposed.

16. A method for forming a fin field effect transistor (FinFET) device structure, comprising:

forming a fin structure over a substrate;
forming a gate structure over the fin structure;
forming a first hard mask layer over the gate structure;
forming a contact over the fin structure; and
forming a second hard mask layer over the contact and a portion of the first hard mask layer, wherein a top surface of the first hard mask layer is leveled with a top surface of the second hard mask layer.

17. The method for forming the fin field effect transistor (FinFET) device structure as claimed in claim 16, further comprising:

forming a recess in the first hard mask layer, wherein the second hard mask layer extends into the recess.

18. The method for forming the fin field effect transistor (FinFET) device structure as claimed in claim 16, further comprising:

forming an etch stop layer (ESL) over the first hard mask layer and the second hard mask layer; and
forming a conductive plug penetrating through the ESL.

19. The method for forming the fin field effect transistor (FinFET) device structure as claimed in claim 16, further comprising:

forming a source/drain (S/D) structure over the fin structure and adjacent to the gate structure;
forming a temporal hard mask layer over the gate structure; and
after the temporal hard mask layer is formed, forming a contact opening exposing the S/D structure.

20. The method for forming the fin field effect transistor (FinFET) device structure as claimed in claim 19, further comprising:
   forming a sacrificial layer in the contact opening;
   replacing the sacrificial layer with the contact; and
   removing the temporal hard mask layer.

\* \* \* \* \*